United States Patent
Jin et al.

[11] Patent Number: 5,570,010
[45] Date of Patent: Oct. 29, 1996

[54] METHOD AND APPARATUS FOR IDENTIFYING OBJECTS USING COMPOUND SIGNAL AND A DETECTOR EMPLOYING AN ELECTRICAL STATIC COUPLING TECHNIQUE

[75] Inventors: Dongzhi Jin, Chiba; Masaei Numanami, Tokyo; Fumihiko Abe, Chiba; Kazuhiro Miyazawa, Ichihara, all of Japan

[73] Assignee: The Furukawa Electric Co., Ltd., Tokyo, Japan

[21] Appl. No.: 185,953

[22] PCT Filed: May 20, 1993

[86] PCT No.: PCT/JP93/00667

§ 371 Date: Jan. 18, 1994

§ 102(e) Date: Jan. 18, 1994

[87] PCT Pub. No.: WO93/23759

PCT Pub. Date: Nov. 25, 1993

[30] Foreign Application Priority Data

| May 20, 1992 | [JP] | Japan | 4-127209 |
| May 27, 1992 | [JP] | Japan | 4-134751 |
| Jun. 19, 1992 | [JP] | Japan | 4-160774 |
| Jun. 30, 1992 | [JP] | Japan | 4-172385 |
| Feb. 4, 1993 | [JP] | Japan | 5-017214 |
| Feb. 9, 1993 | [JP] | Japan | 5-020954 |

[51] Int. Cl.$^6$ ............ G01R 19/00; G01R 15/04; G01R 31/02

[52] U.S. Cl. ................................................ 324/67

[58] Field of Search ........................... 324/66, 67, 527, 324/528, 529, 530, 539, 232

[56] References Cited

U.S. PATENT DOCUMENTS

| 4,506,210 | 3/1985 | Chase | 324/66 |
| 4,686,454 | 8/1987 | Pecukonis | 324/67 |

FOREIGN PATENT DOCUMENTS

| 46-14654 | 5/1971 | Japan. |
| 59-170273 | 11/1984 | Japan. |
| 62-52826 | 11/1987 | Japan. |
| 64-9593 | 2/1989 | Japan. |

*Primary Examiner*—Walter E. Snow
*Attorney, Agent, or Firm*—Frishauf, Holtz, Goodman, Langer & Chick

[57] ABSTRACT

When identifying particular cable A among a plurality of cables housed in a trough, a signal applying section 10 compounds three different frequency signals, which are generated by an oscillating circuit section 11, by a potential signal compounding & applying circuit 15 and applies it to conductor A1 of the particular cable A. In a detecting section 20, a detecting circuit 22 detects the compound signal via an electrode 21, which is electrostatically coupled with particular cable A, an amplifying circuit 23 subjects the compound signal to gain adjustment, and a signal identifying circuit 24 identifies particular cable A from the compound signal.

30 Claims, 19 Drawing Sheets

COMPOUND SIGNAL WAVE

INPUT SIGNAL WAVE

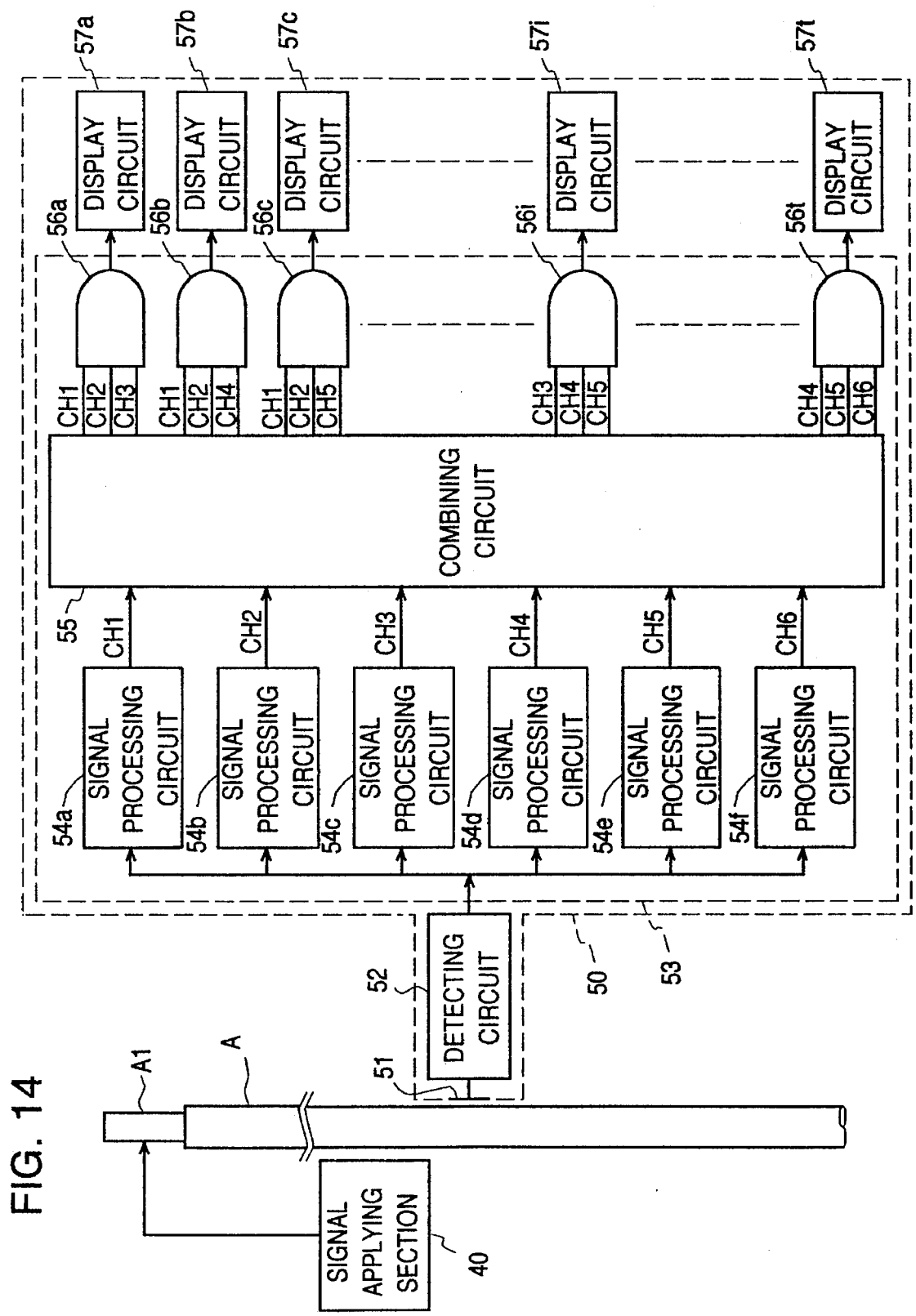

SIGNAL WAVEFORM OF 8-CORE CABLE BEFORE APPLYING VOLTAGE SIGNAL

SIGNAL WAVEFORM OF 8-CORE CABLE AFTER APPLYING VOLTAGE SIGNAL

SIGNAL WAVEFORM OF 19-CORE CABLE BEFORE APPLYING VOLTAGE SIGNAL

SIGNAL WAVEFORM OF 19-CORE CABLE AFTER APPLYING VOLTAGE SIGNAL

SIGNAL WAVEFORM OF THIN CABLE AFTER APPLYING VOLTAGE SIGNAL 5,570,010

METHOD AND APPARATUS FOR IDENTIFYING OBJECTS USING COMPOUND SIGNAL AND A DETECTOR EMPLOYING AN ELECTRICAL STATIC COUPLING TECHNIQUE

TECHNICAL FIELD

The present invention relates to a method, its electroscope, and an input circuit of the electroscope for identifying electrically conductive objects to be identified, e.g., for identifying at least one cable among plurality of cables contained in a housing (hereinafter referred to as "trough") such as a trough for railroads and a terminal box.

BACKGROUND ART

A trough usually contains a few dozen cables. These cables may include ones, the service lives thereof having expired due to deterioration with time or ones that have incurred failures and are not serviceable. In such a situation, when a new cable or cables are to be laid in the trough, it frequently happens that the new cable cannot be laid unless such unusable cables are removed from the trough.

When laying a new cable, however, a worker may not be able to identify which cable or cables in the trough are necessary and which one or ones are unnecessary. For this reason, there is a marked increase in the number of cases where workers are unable to remove unnecessary cables from troughs. In addition, accidents wherein workers erroneously remove cables in service when laying new cables have occurred. Therefore, in this technical field, there has been a demand for an apparatus which enables workers to open the cover of a trough in a desired place and locate a particular cable.

In the past, in response to such a demand, there was a method whereby a cable was identified by applying a 100VAC voltage to a conductor of the cable to be removed and detecting the voltage by using a commercially available electroscope. However, a 100VAC voltage is constantly applied to most cables in troughs. In this method, therefore, a plurality of cables occasionally react at the same time, making it difficult to identify cables. Furthermore, there is such a danger that a worker may get an electric shock from touching a cable to which the 100VAC voltage is applied.

So, as another identifying method, there was a method wherein a prescribed current is let flow through a particular cable to be removed, the cable in the trough is clamped with a cable probe consisting of a search coil, and the current flowing through the cable is detected using an electromagnetic induction method, thereby identifying the particular cable.

This identifying method, however, presented a problem in that a circuit such as a common grounded circuit for letting currents flow through a cable to be removed was required. The identifying method had another problem in that its cable identifying reliability was low because it was susceptible to noises in its surroundings. There was still another problem in that if the identifying method was used for a portable apparatus, dry cells for causing currents to flow through cables were exhausted quickly. Moreover, according to the identifying method, cables must be clamped and checked one by one using the search coil to locate a particular cable among a plurality of cables by increasing sensitivity, thus resulting in poor work efficiency.

DISCLOSURE OF THE INVENTION

An object of the present invention is to provide a method for identifying objects to be identified, which method enables improved work efficiency of identifying electrically conductive objects to be identified.

Another object of the present invention is to provide a method for identifying objects to be identified, which method enables higher immunity to noises in surroundings and higher reliability in identifying objects to be identified.

Still another object of the present invention is to provide a method for identifying objects to be identified, which method makes it possible to reduce the exhaustion of dry cells.

Yet another object of the present invention is to provide a method for identifying objects to be identified, wherein a judgment standard for identifying objects to be identified is automatically set in accordance with the conditions of the objects to be identified.

To fulfill the objects described above, the method for identifying objects to be identified according to the present invention is provided with an applying step for directly applying a signal of a specific frequency from an oscillating circuit to a particular object to be identified among a plurality of electrically conductive objects to be identified which are stored in a particular housing, and an identifying step wherein the signal of the aforesaid specific frequency is detected among the aforesaid particular object to be identified through a detecting section which employs an electrostatic coupling method, thereby identifying the aforesaid particular object to be identified.

The signal of the specific frequency applied by the applying section to the particular object to be identified is comprised of a compound signal of a plurality of frequency signals having different frequencies; the compound signal is detected through an electrostatic coupling type non-contact detecting section, and the detected signal is subjected to gain adjustment.

As described above, according to the present invention, the compound signals applied by the applying section are detected by the detecting section from the individual objects to be identified, thus identifying particular objects to be identified which are not in service. Specifically, when the identifying method according to the present invention is used for identifying cables, there is almost zero probability that a potential signal having the same level as that of the compound signal exists at the same time in a cable which is actually being used; therefore, the particular cables can be identified efficiently without making erroneous judgment.

BRIEF DESCRIPTION OF DRAWINGS

The drawings show an embodiment of the present invention, wherein

FIG. 14 is a block diagram which shows the configuration of an identifying apparatus which employs the second embodiment of the method for identifying objects to be identified according to the present invention.

Best Mode of Carrying Out of the Invention

The embodiments of the present invention will now be explained with reference to FIG. 1 through FIG. 24.

Figure 1:
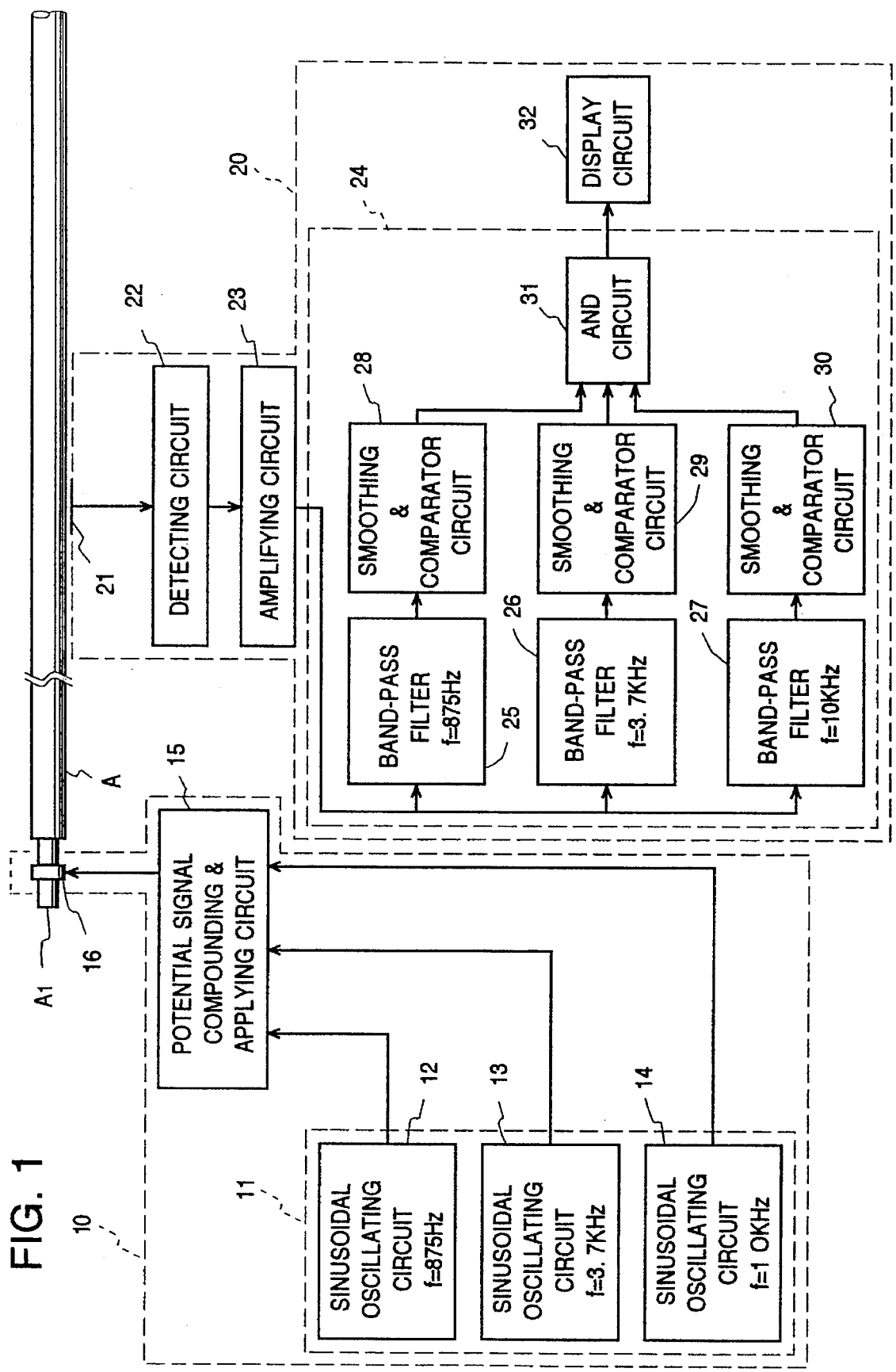
FIG. 1 is a block diagram indicating a configuration of an identifying apparatus which employs the first embodiment of the method for identifying an object to be identified according to the present invention.

FIG. 1 is the block diagram which shows the configuration of the identifying apparatus that employs the first embodiment of the method for identifying objects to be identified according to the present invention. Referring to FIG. 1, a particular cable A is sheathed with an insulator and housed in a trough with other cables which are not shown. The identifying apparatus comprises a signal applying section 10 which applies a potential signal of a specific frequency to conductor A1 of particular cable A, and a signal detecting section 20 which is provided in contact or not in contact with particular cable A to detect the potential signal of the specific frequency. The applying section 10 is spaced away from the detecting section 20 with any distance; the detecting section 20 detects the potential signal of the specific frequency through an opened cover of the trough at any place away from the applying section 10, and identifies particular cable A among the cables which are housed.

The signal applying section 10 is comprised of an oscillating circuit section 11, which issues potential signals of different types (channels) of frequencies specified in advance (hereinafter referred to as "frequency signals"), a potential signal compounding & applying circuit 15 which compounds those frequency signals and applies them to conductor A1 of particular cable A, and a tool (clip) 16 which is attached to the conductor A1 to apply the potential signals received from the potential signal compounding & applying circuit 15 to conductor A1.

The oscillating circuit section 11 is comprised of, for example, three sinusoidal oscillating circuits 12 through 14. The sinusoidal oscillating circuits 12 through 14 generate three channels of sinusoidal potential signals of, for example, 875 [Hz], 3.7 [kHz], and 10 [kHz], which are not normally used much. As the oscillating circuit section 11 according to the present invention used in this embodiment, a circuit, which generates, for example, a particular frequency signal at regular time intervals, may alternatively be used.

Figure 2:
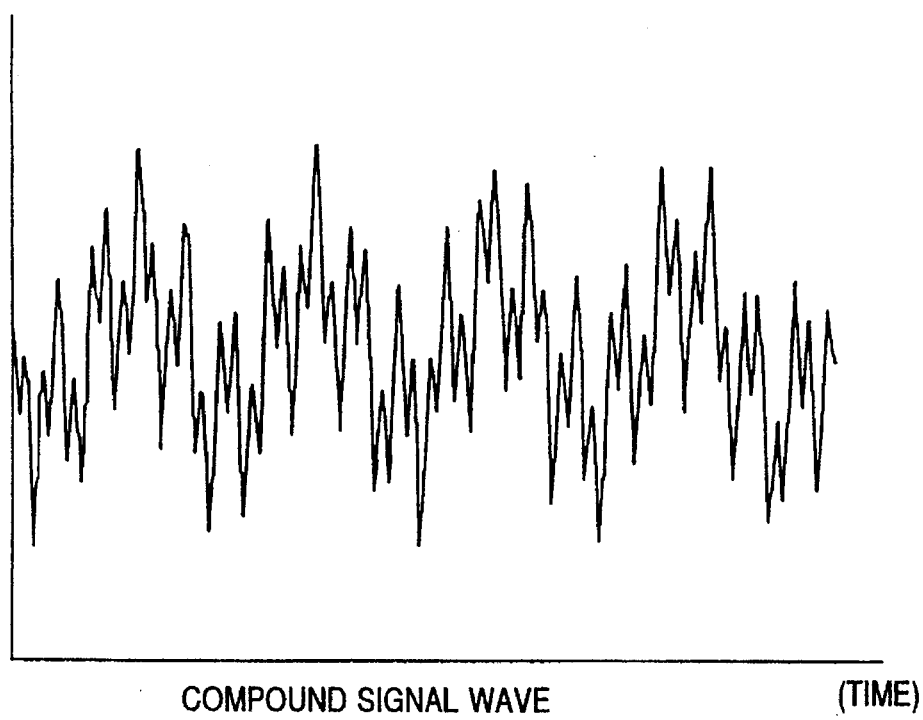
FIG. 2 is a waveform chart of a compound signal which is applied to a conductor of a cable shown in FIG. 1.
Figure 31:
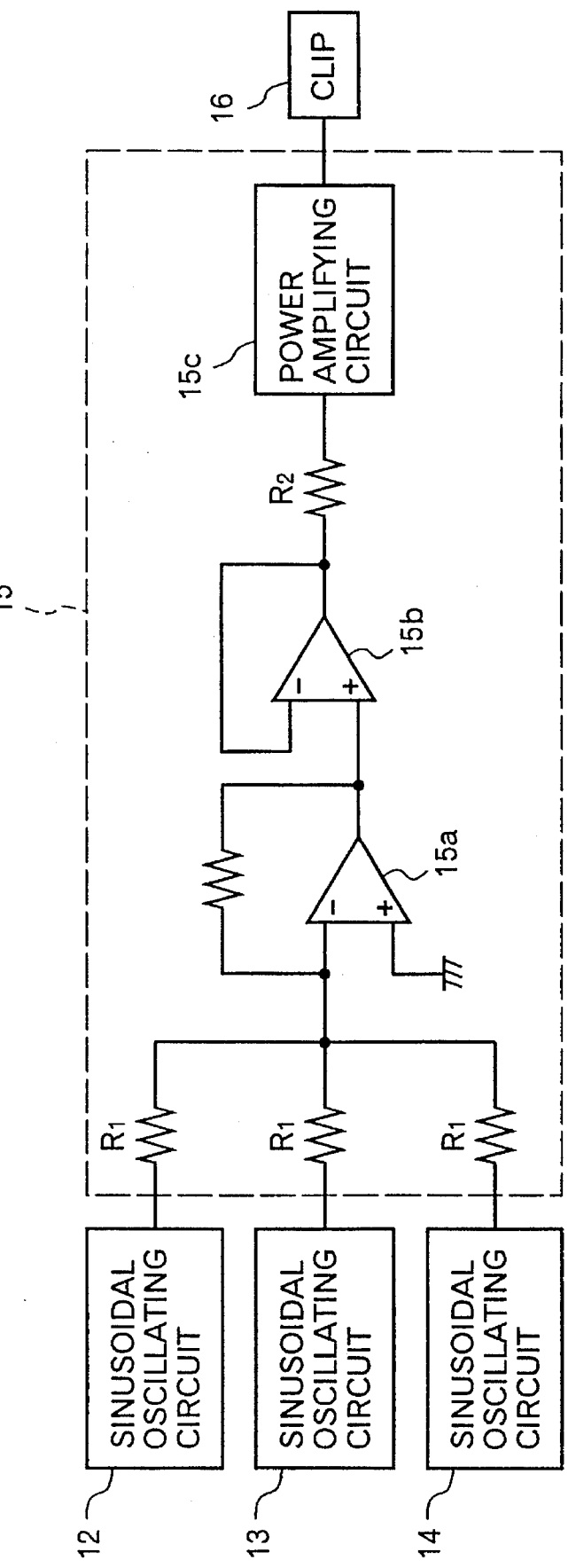
FIG. 31 is a circuit diagram showing a configuration of a signal applying section.

The potential signal compounding & applying circuit 15 compounds the frequency signals of the three channels and issues a compound signal which has a waveform shown in FIG. 2. Referring now to FIG. 31, potential signal compounding & applying circuit 15 comprises two operational amplifiers (OPamp) 15a and 15b connected with sinusoidal oscillating circuits 12–14 through individual resistors R1 having the same resistance, and a power amplifying circuit 15c connected through the operational amplifier 15b and a resistor $R_2$. These operational amplifiers 15a and 15b set frequency signals outputted from the respective sinusoidal oscillating circuits 12–14 to an approximately same level and compounds these frequency signals, and thereafter, outputs the compound signal to the power amplifying circuit 15c. Then, the power amplifying circuit 15c amplifier the compound signal, and outputs it to the clip 16. The compound signal is applied to conductor A1 of particular cable A via the clip 16.

The signal detecting section 20 is comprised of a signal electrode 21 which consists of a metallic plate disposed in the vicinity of particular cable A sheathed with an insulator, a detecting circuit 22 which is connected to the signal electrode 21 to detect the potential signals from conductor A1, an amplifying circuit 23 which amplifies potential signals and which permits adjusting the gain of amplification, a signal identifying circuit 24 which identifies particular cable A from the amplified potential signal, and a display circuit 32 which indicates the identified particular cable A.

Figure 3:
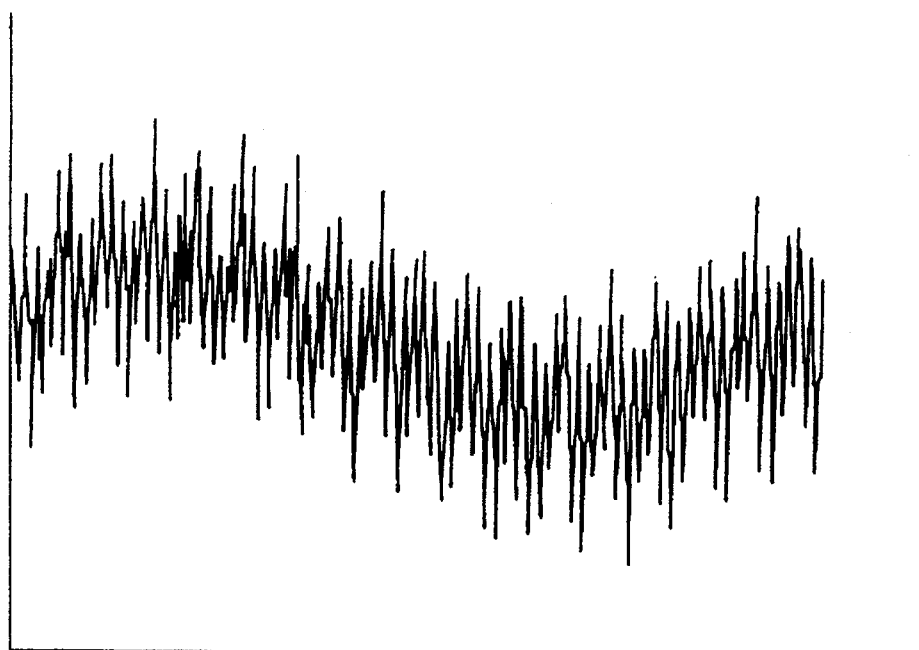
FIG. 3 is another waveform chart of an input signal detected from the conductor of the cable.

In this detecting section 20, an extremely small capacitance exists between the signal electrode 21 and the conductor A1 of the particular cable A. The potential of conductor A1 is detected by this electrostatic coupling, and therefore, the detecting circuit 22 uses a buffer circuit with an extremely high input impedance; in this embodiment, a voltage follower circuit, which employs, for example, a field effect transistor (hereinafter referred to as "FET"), is used to detect an input signal having a waveform as shown in FIG. 3. This input signal includes noise components of 50 [Hz], for example, and other frequencies in addition to the signal frequency components of the three channels of 875 [Hz], 3.7 [kHz], and 10 [kHz]discussed above.

Figure 4:
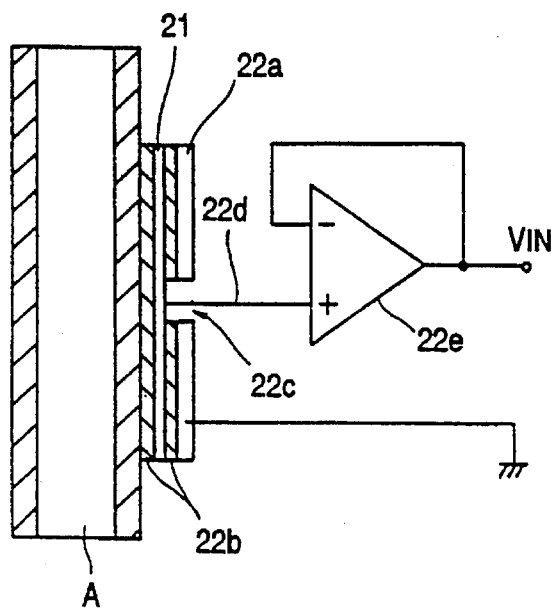
FIG. 4 is a principle diagram which shows a principle of an electroscope according to the present invention.

The detecting circuit 22 is comprised of an electroscope equipped with a voltage follower circuit consisting of, for example, J (Junction) FET operational amplifier which has an extremely high input impedance. Referring to FIG. 4, in the electroscope, the signal electrode 21 and an earthing electrode 22a, which are in contact with cable A via insulating layers 22b, consist of two metallic plates, the insulating layers 22b existing between the signal electrode 21 and the earthing electrode 22a. The earthing electrode 22a has a small hole 22c opened to let a lead wire 22d of the signal electrode 21 pass through it at its middle portion. The lead wire 22d is connected to a positive input terminal of a voltage follower circuit 22e comprised of the JFET operational amplifier.

Figure 5:
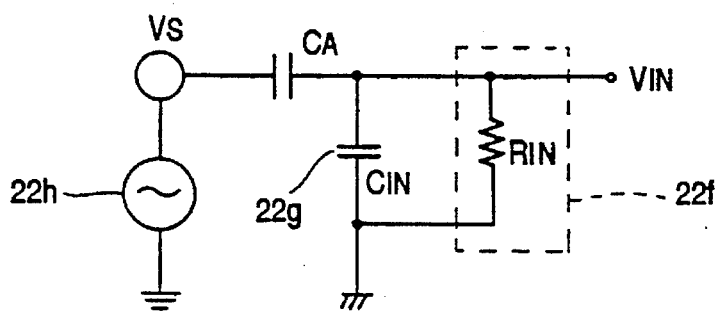
FIG. 5 is a diagram which shows an equivalent circuit of the electroscope shown in FIG. 4.

Referring to FIG. 5 which shows the equivalent circuit of the electroscope of FIG. 4, the signal electrode 21 and the earthing electrode 22a constitute a capacitor 22g which is connected in parallel to an input circuit 22f of the electroscope. Its capacitance $C_{IN}$ is determined from the following:

$$C_{IN} = K\epsilon \times 8.855 \times 10^{-12} \times S/d \quad (1)$$

where

S: Area of metallic plate d: Thickness of insulating layer

Kε: Dielectric constant of insulating layer

In FIG. 5, Vs is the signal voltage applied to the cable, $V_{IN}$ is an input voltage to the amplifying circuit, $C_A$ is an electrostatic coupling capacitance between the signal electrode and a cable conductor, $R_{IN}$ is an input impedance of the input circuit 22f consisting of the voltage follower circuit 22e, and 22h is a voltage applied.

Figure 7:
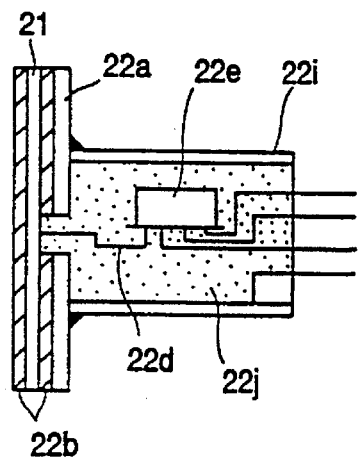
FIG. 7 is a sectional view taken on line 7—7 in FIG. 6.
Figure 6:
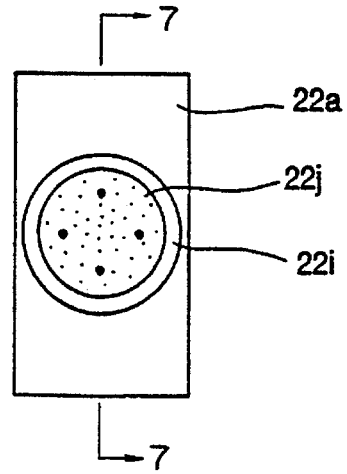
FIG. 6 is a diagram which shows an embodiment of the electroscope shown in FIG. 4.

The specific embodiment of the electroscope shown in FIG. 4 will have a configuration as shown in FIG. 6 and FIG. 7 which is a sectional view taken on line 7—7 of FIG. 6. In FIG. 6 and FIG. 7, like parts are shown by the same reference characters as in FIG. 4 for the convenience of explanation. The same reference characters are also used for the convenience of explanation in FIG. 8 through FIG. 13 to be discussed later.

Referring to FIG. 6 and FIG. 7, the signal electrode 21, the insulating layers 22b, and the earthing electrode 22a are all shaped rectangularly, and a cylindrical metallic plate 22i is fixed on the earthing electrode 22a. In the aforesaid metallic plate 22i, the operational amplifier 22e is included and molded with insulating resin 22j to improve the reliability and safety of the electroscope.

In the embodiment shown in FIG. 6 and FIG. 7, the area S of the metallic plates of the signal electrode 21 and the earthing electrode 22a is 16 [mm]×30 [mm]=480 [mm²]. Further, the insulating layers 22b use plastic films and the thickness d is 0.5 [mm]and the dielectric constant Kε is 2. In this case, the capacitance $C_{IN}$ of a capacitor formed by the signal electrode 21 and the earthing electrode 22a is approximately 17[PF]from the formula (1).

The magnitude of capacitance $C_{IN}$ should be about ten plus times to a few dozen times electrostatic coupling capacitance $C_A$. In this case, if the impedance of the capacitance $C_{IN}$ is taken as $Z_{IN}$, the relation of $Z_{IN}$ <impedance $Z_A$ of coupling capacitance $C_A$ is established, so that it is obvious that the relation of $Z_{IN}$<< an input impedance $R_{IN}$ of Input circuit 22f is established. Accordingly, an approximate value of input voltage $V_{IN}$ can be determined by:

$$V_{IN} = Vs \cdot Z_{IN}/(Z_{IN} + Z_A)$$

The magnitude of impedance $Z_A$ is approximately a few dozen times impedance $Z_{IN}$, and therefore, input voltage $V_{IN}$ is one few-dozens of applied signal voltage Vs. As a result, it becomes completely impossible to saturate the output voltage of the input circuit 22f from a 50 [Hz] noise. Of course, although the signal voltage detected also becomes one few-dozenths, the noise other than the signal voltage can be removed by band-pass filters 25–27 which will be described later. Further, impedances $Z_{IN}$ and $Z_A$ also vary with the signal frequency; therefore, input voltage $V_{IN}$ is independent of the signal frequency, making it convenient for the signal processing to be discussed later.

In this embodiment, when a capacitor, which is equivalently formed with the signal electrode and the earthing electrode, is connected in parallel to the input circuit and the capacitance of the capacitor is adjusted to a dozen times the electrostatic coupling capacitance, the magnitude of the impedance of the electrostatic coupling capacitance becomes about a dozen times the impedance of the capacitance of the capacitor. Accordingly, the input voltage becomes one few-dozenths of the applied signal voltage. Namely, a level of the applied signal voltage from the signal applying section 10 has a relationship proportional to a level of the signal voltage detected in the signal detecting section 20. As a result, in this embodiment, the saturation of the output voltage of the input circuit due to the 50 [Hz] noise can be prevented, making it possible to easily detect the frequency signals of the three channels applied to the cable independently of frequencies.

Figure 8:
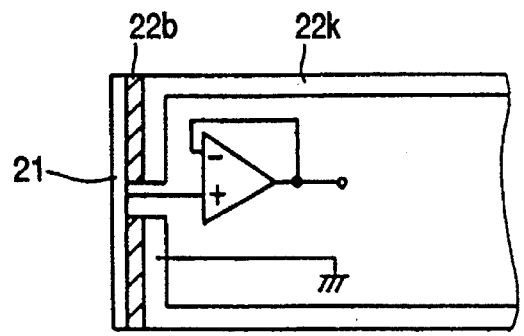
FIG. 8 is a diagram which shows another embodiment of the electroscope.

The electroscope according to the present invention is not limited to the embodiment shown in FIG. 6 and FIG. 7. More specifically, as shown in FIG. 8, for instance, there is also a version comprised of an earthing electrode and a cylindrical metallic plate which are combined into one piece to form a metallic case 22k.

Figure 9:
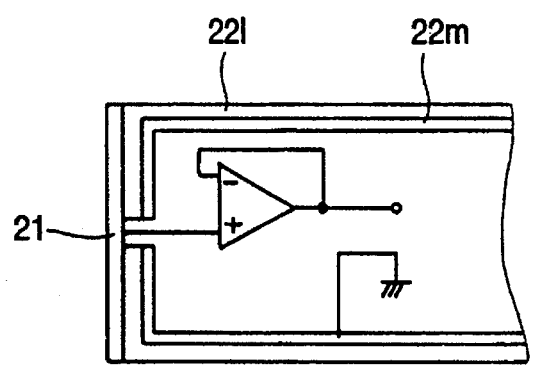
FIG. 9 is still another embodiment of the electroscope.

As shown in FIG. 9, there is another version wherein a plastic case 22l is attached to a signal electrode 21, the inner wall of the plastic case 22l being provided with metallic plating 22m.

Figure 10:
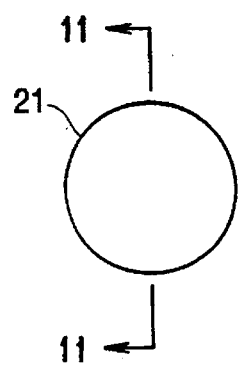
FIG. 10 is yet another embodiment of the electroscope.
Figure 11:
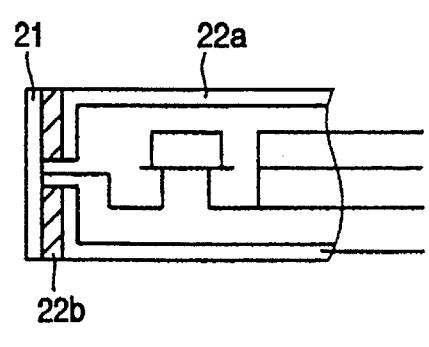
FIG. 11 is a sectional view taken on line 11—11 in FIG. 10.

As shown in FIG. 10 and FIG. 11, which is a sectional view taken along line 11—11 of FIG. 10, there is still another version wherein the signal electrode 21 is formed into a disc shape and a cylindrical earthing electrode 22a is attached to the signal electrode 21 via the insulating layer 22b.

Figure 13:
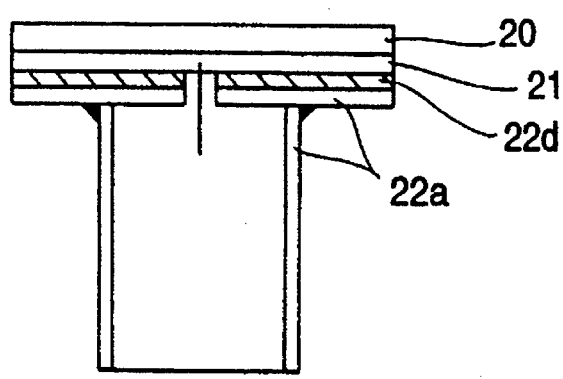
FIG. 13 is a sectional view taken on line 13—13 in FIG. 12.
Figure 12:
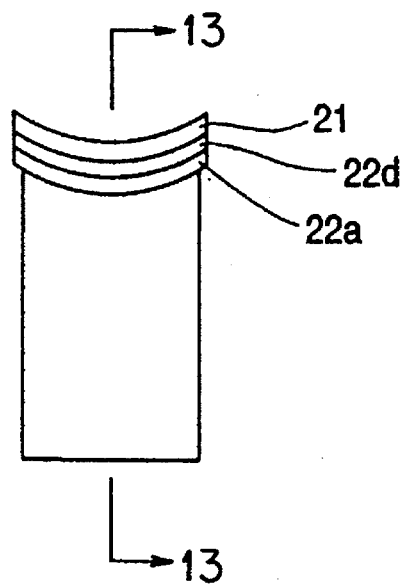
FIG. 12 is a still further embodiment of the electroscope.

Further, as shown in FIG. 12 and FIG. 13, which is a sectional view taken along line 13—13 of FIG. 12, the electroscope may alternatively be a version wherein the signal electrode 21, the insulating layer 22d, and the earth electrode 22a are curved so that the electroscope can be closely attached to cable A which is the object to be subjected to measurement.

The magnitude of the potential signal detected through the detecting circuit 22 changes with the following major causes:

(1) Distance between the signal electrode 21 and conductor $A_1$ (2) Dielectric constant of the insulating layer material of particular cable A (3) Input impedance of the detecting circuit 22

Hence, to cope with such changes, an amplifying circuit 23 is required to amplify input signals.

Figure 32:
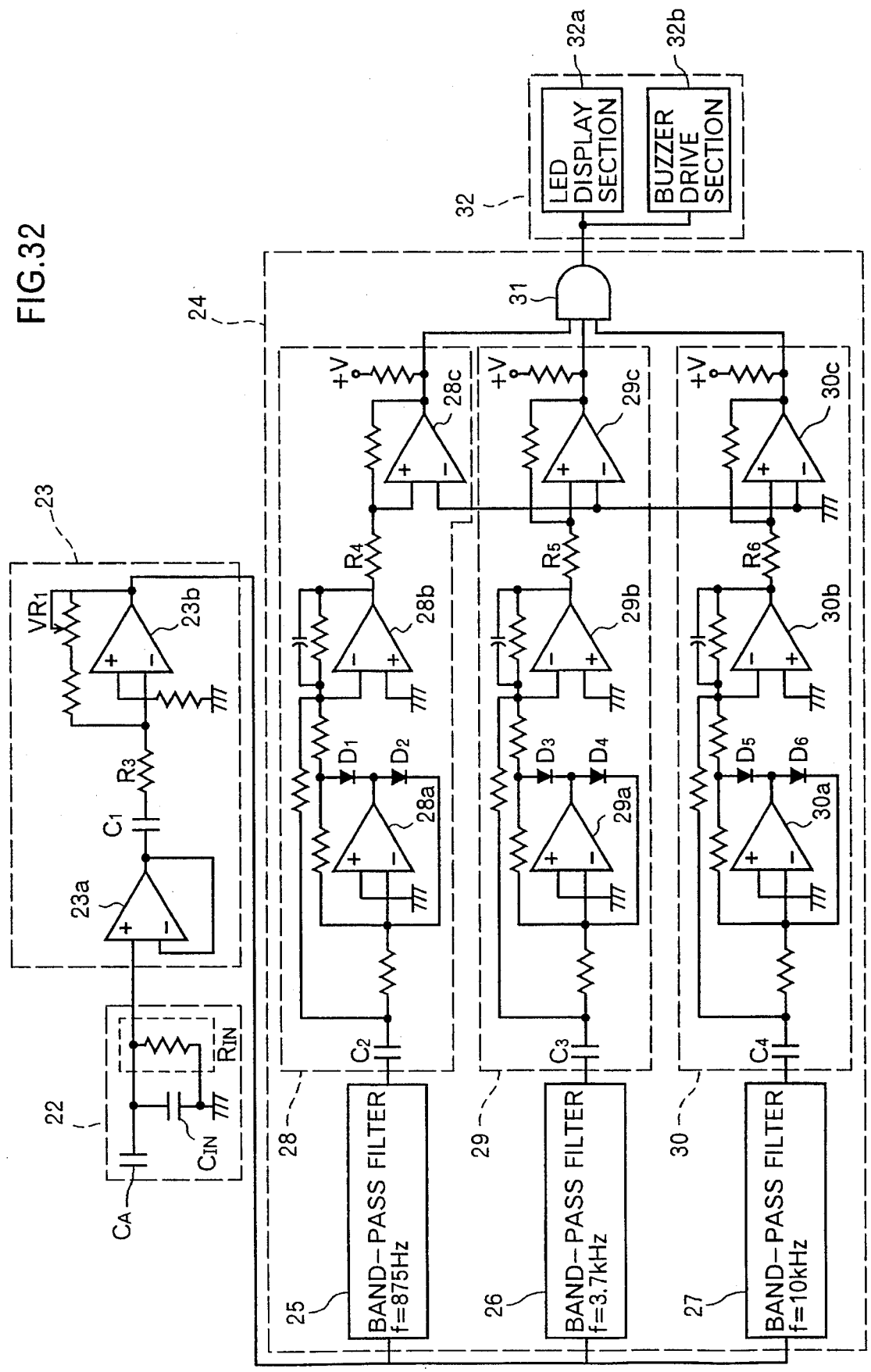
FIG. 32 is a circuit diagram showing a configuration of a detecting section shown in FIG. 1.

The amplifying circuit 23 has an important function in addition to amplifying input signals; it is to locate a particular cable out of a dozen cables housed in the same trough. Referring now to FIG. 32, amplifying circuit 23 comprises an operational amplifier 32a connected to the detecting circuit 22, an operational amplifier 23b connected through the operational amplifier 32a, a capacitor $C_1$ and a resistor $R_3$, and a variable resistor VR1. Further, the amplifying circuit 23 is set so that a gain (sensitivity) may be adjusted. To locate particular cables, the gain of the amplifying circuit 23 is set to its maximum level by adjusting a resistance of the variable resistor $Vr_1$, and an approximate range wherein a particular cable A, to which the compound signal is being applied, is present, is identified in the trough. Subsequently, the gain is adjusted to an appropriate level by changing a resistance of the variable resistor $VR_1$, and the cables existing in the range are checked one by one to locate a particular cable A. This, in the embodiment, saves the time and labor to check all the cables in the trough one by one through the detecting section 20, significantly saving work time.

The sensitivity indicates the greatest distance from which the signal electrode 21 can identify target particular cable A accurately. Specific practical equipment with a high sensitivity can accurately identify particular cable A even when the signal electrode 21 is a few centimeters away from particular cable A.

The signal identifying circuit 24 comprises band-pass filters 25 through 27, which let three types of particular frequency signals, respectively, among the input signals described above to pass through them, smoothing & comparator circuits 28 through 30 which are connected to the band-pass filters 25 through 27, and an AND circuit 31 which performs AND operation on the comparison results received from the smoothing & comparator circuits 28 through 30.

The band-pass filters 25 through 27 correspond to sinusoidal oscillating circuits 12 through 14; and they detect the frequency signals of the three channels, 875 [Hz], 3.7 [kHz], and 10 [kHz] generated by the sinusoidal oscillating circuits 12 through 14. The noise components contained in the input signals are removed by the band-pass filters 25 through 27.

The smoothing & comparator circuits 28 through 30 are provided corresponding to the band-pass filters 25 through 27. The smoothing & comparator circuit 28, as shown in FIG. 32, comprises two operational amplifiers 28a and 28b connected to the band-pass filter 25 through a capacitor $C_2$, diodes $D_1$ and $D_2$, and a comparator 28c connected through the operational amplifier 28b and a resistor $R_4$. The smoothing & comparator circuit 29 comprises two operational amplifiers 29a and 29b connected to the band-pass filter 26 through a capacitor $C_3$, diodes $D_3$ and $D_4$, and a comparator 29c connected through the operation amplifier 29b and a resistor R5. The smoothing & comparator circuit 30 comprises two series-connected operational amplifiers 30a and 30b connected to the band-pass filter 27 through a capacitor $C_4$, diodes $D_5$ and $D_6$, and a comparator 30c connected through the operational amplifier 30b and a resistor $R_6$. These operational amplifiers 28a, 28b, 29a, 29b, 30a, 30b and diodes $D_1$ to $D_6$ rectify and smooth the frequency signal passing through the band-pass filters 25 through 27. Moreover, the comparators 28c, 29c and 30c individually compare the smoothed frequency signals with a specified reference signal. More specifically, the smoothing & comparator circuits 28 through 30 judge whether the frequency signal levels are higher or lower than the prescribed threshold value levels which are preset in the circuits 28 through 30. And if the frequency signal levels are higher than the reference signal levels, then the smoothing & comparator circuits 28 through 30 apply an output "1" to the AND circuit 31.

When the outputs from the three smoothing & comparator circuits 28 through 30 are all "1", the AND circuit 31 gives the output "1". The output of the AND circuit 31 indicates that the frequency signals of the three channels issued by the sinusoidal oscillating circuits 12 through 14 have been detected.

The display circuit 32 comprises a LED display section 32a and a buzzer drive section 32b, as shown in FIG. 32. If an output of the AND circuit 31 is "1", an LED lamp of the LED display section is lit, and the buzzer drive section causes a light and the buzzer to sound. By so doing, the display circuit 32 indicates that the cable close to the signal electrode 21 is particular cable A to which the frequency signal has been applied.

Hence, in this embodiment, the signal applying section applies three different frequency signals, which are usually very unlikely to be used at the same time, to the particular cable and the signal detecting section close to the cable detects the frequency signals. This makes it possible, in this embodiment, to efficiently identify a particular cable without erroneous judgment, permitting improved reliability in identifying cables.

Additionally, in this embodiment, the signal detecting section is formed by electrostatic coupling with respect to the cables, making it possible to control the currents, which are applied to the cables, to an extremely low level. Therefore, when the identifying apparatus according to this embodiment is used as a portable apparatus, the exhaustion of the dry cells is reduced, making it an ideal portable apparatus.

Further, in this embodiment, the amplifying circuit with adjustable sensitivity is used; therefore, a particular cable can be detected with high sensitivity even if the distance between the electrode and a conductor increases, permitting improved work efficiency.

The sensitivity of the signal detecting section for locating a particular cable can be increased by increasing the gain of the amplifying circuit 23 as discussed above. The present invention, however, is not limited to that; the sensitivity of the signal detecting section can be increased by, for example, lowering the threshold value levels of the reference signals of the smoothing & comparator circuits 28 through 30.

Further, in this embodiment, three different frequency signals are compounded to provide the compound signal, however, the present invention is not limited to that; two or four or more different frequency signals may be compounded to provide the compound signal.

Furthermore, objects to be measured can be identified by the present invention as long as they are electrically conductive lengthy objects including iron pipes, iron-wirearmored plastic pipes consisting of plastic pipes wrapped with iron wires, steel-stranded wires (steel wires) used as the tension wires for bridges and the like, and fluid transport tubes reinforced with metals, in addition to cables such as regular electric wires.

The following discusses how each of a plurality of cables housed in a trough is identified.

FIG. 14 is the block diagram showing the configuration of the identifying apparatus which employs the second embodiment of the identifying method for objects to be identified according to the present invention. Referring to FIG. 14, the identifying apparatus comprises a signal applying section 40, which applies potential signals of a plurality of combined specific frequencies to the cable conductors sheathed with insulators, and a signal detecting section 50 which is provided in contact or not in contact with one of the cables, e.g., cable A, and which detects the potential signal of the specific frequency. As in the first embodiment, the applying section 40 is spaced away from the detecting section 50 with any distance; as soon as the detecting section 50 identifies a cable, it detects the potential signal of the specific frequency of another cable through contact or no contact with the cable, thus identifying all cables housed in a trough one by one.

Figure 15:
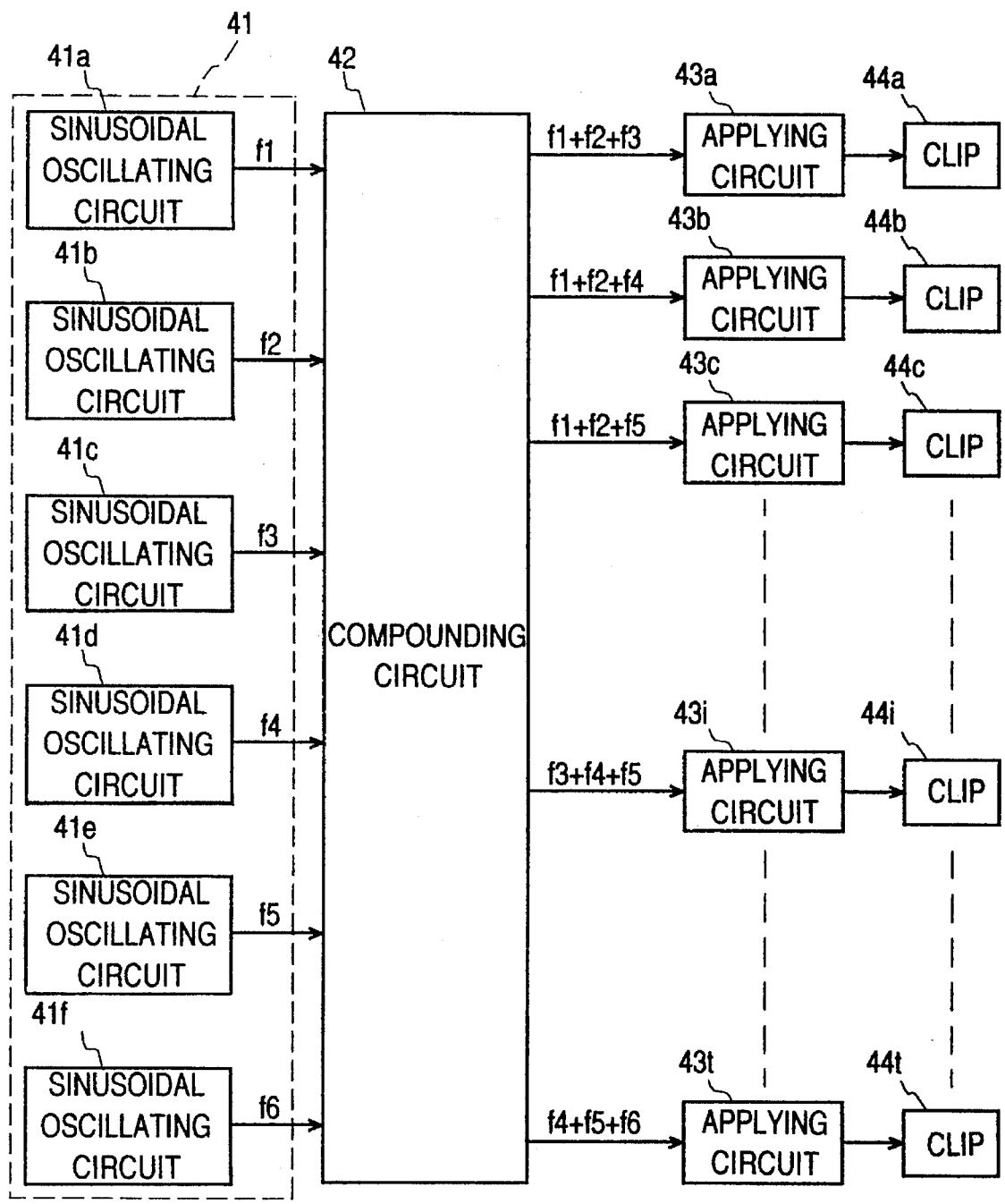
FIG. 15 is a block diagram which shows the configuration of an applying section shown in FIG. 14.

Referring to FIG. 15, the signal applying section 40 comprises an oscillating circuit section 41 which generates six different preset channels of frequency signals f1 through f6, a compounding circuit 42 which compounds signals of three channels of different combinations from the frequency signals, applying circuits 43a through 43t which apply the composite signals to the conductors of the cables which are defined in advance, and clips, 44a through 44t which are attached to the conductors to apply the composite signals from the applying circuits 43a through 43t to the conductors.

The oscillating circuit section 41 comprises sinusoidal oscillating circuits 41a through 41f which are the signal sources for generating sinusoidal potential signals of, for example, six channels of frequencies f1 through f6 which are not usually used much.

The compounding circuit 42 compounds three types of signals of different combinations from the six received different frequency signals and outputs them. A number K of the different combinations can be determined by the following formula:

$$K = N!/M!\cdot(N-M)! \qquad (2)$$

where

N: Number of signal sources
M: Number of composite samples

In the case of this embodiment, N=6 and M=3; therefore, substituting these values for the formula (2) results in K=20. This means that, in this embodiment, up to twenty cables can be identified at a time. Accordingly, in this embodiment, twenty applying circuits and twenty clips are required.

The signal detecting section 50 comprises a signal electrode 51 which consists of a metallic plate disposed near particular cable A sheathed with an insulator, a detecting circuit 52 which is connected to the signal electrode 51 and detects a potential signal from conductor A1, a signal identifying circuit 53 which identifies a cable according to a detected potential signal, and display circuits 57a through 57t which indicate identified cables.

In the detecting section 50, the detecting circuit 52 comprises an electroscope equipped with a voltage follower circuit consisting of a JFET operational amplifier because of the same reason as the first embodiment and it detects input signals.

The signal identifying circuit 53 comprises signal processing circuits 54a through 54f which carry out prescribed signal processing on detected potential signals, a combining circuit 55 which combines the six processed outputs CH1 through CH6, three each, and AND circuits 56a through 56t which perform AND operation on the combined outputs, three each.

Each of the signal processing circuits channels 54a through 54f of six channels comprises an amplifying circuit which is provided because of the same reason as the first embodiment and which is not illustrated, a band-pass filter which allows a particular frequency signal among input signals to pass through, and a smoothing & comparator circuit which smoothes the frequency signals, which have passed through the band filters, and compares the frequency signals with reference signals.

The band-pass filters correspond to the sinusoidal oscillating circuits 41a through 41f and their central frequencies are preset so that they are equivalent to the six different signal frequencies f1 through f6 which are generated by the sinusoidal oscillating circuits 41a through 41f. Therefore, noise components contained in input signals are removed by the band-pass filters.

The smoothing & comparator circuits are provided so that they correspond to the band-pass filters, and as in the case with the first embodiment, they compare the smoothed frequency signals with the threshold value levels of the reference signals. If the frequency signals are larger than the reference signals, then the smoothing & comparator circuits set the outputs CH1 through CH6 applied to the combining circuit 55 to "1".

The combining circuit 55 combines the six outputs CH1 through CH6, which have been processed by the signal processing circuits 54a through 54f, three each as in the case of the compounding circuit 42 and supplies them to the AND circuits 56a through 56t.

If all the three outputs from the combining circuit 55 are "1", then the AND circuits 56a through 56t set their outputs to "1". These AND circuits 56a through 56t correspond to the applying circuits 43a through 43t, and the outputs of the AND circuits 56a through 56t indicate that the three different frequency signals applied to the cables by the applying circuits 43a through 43t have been detected.

Display circuits 57a through 57t have lamps, which correspond to the AND circuits 56a through 56t and which are not illustrated, and they indicate operation results. More specifically, in the display circuits 57a through 57t, if the output of any of the AND circuits 56a through 56t is "1", then the display circuit which corresponds to the AND circuit causes its lamp to light to show which number of cable is the one approximate to the signal electrode 51.

In this embodiment, up to twenty cables can be identified at the same time; therefore, twenty AND circuits and twenty display circuits are required.

The operation of the identifying apparatus shown in FIG. 14 and FIG. 15 will now be described. In FIG. 14, particular cable A to be identified will be the ninth cable Ai and the electrode 51 will be brought close to cable Ai.

The clips 44a through 44t of the signal applying section 40 are attached to the conductors of the cables in the trough, the ninth clip 44i being attached to the conductor of cable Ai.

Under such a condition, the compounding circuit 42 compounds three different frequency signals, f3, f4 and f5, issued from the oscillating circuits 41c through 41e out of the sinusoidal waves f1 through f6 issued from the sinusoidal oscillating circuits 41a through 41f and supplies the result as the compound signal (see FIG. 2) to the applying circuit 43i. The applying circuit 43i then applies the compound signal of the frequency signals f3, f4, and f5 to the conductor of the ninth cable Ai via the clip 44i.

This enables the signal detecting section 50 to detect the compound signal. Specifically, the input signal from particular cable Ai is detected by the detecting circuit 52 via the electrode 51, which is disposed in the vicinity of cable Ai, the input signal exhibiting a waveform which contains the three different frequency components, f3, f4 and f5, and other noise components (see FIG. 3). The input signal is applied to the individual signal processing circuits 54a through 54f of six channels; according to the frequency components of the input signal, outputs CH3 through CH5 of only the signal processing circuits 54c through 54e, which correspond to the sinusoidal oscillating circuits 41c through 41e, become "1".

The combining circuit 55 combines the outputs CH3 through CH5 received from the signal processing circuits 54c through 54e and supplies the result to an AND circuit 56i. This causes the output of only this AND circuit 56i to become "1". The output from the AND circuit 56i causes the display circuit 57i, which is connected to the AND circuit 56i, to light the lamp, thus indicating that the cable to which the signal electrode 51 is close is the ninth cable Ai. Then, bringing the electrode 51 close to other cables in sequence makes it possible to identify all cables in the trough as in the case described above.

The influences exerted by the electrostatic coupling capacitance among the cables in the trough will now be discussed.

There is electrostatic coupling capacitance also among the cables in this trough and it may be well over the electrostatic coupling capacitance between the electrode and the cables. For this reason, to identify the cables, the mutual influences among the cables must be taken into account.

Figure 16:
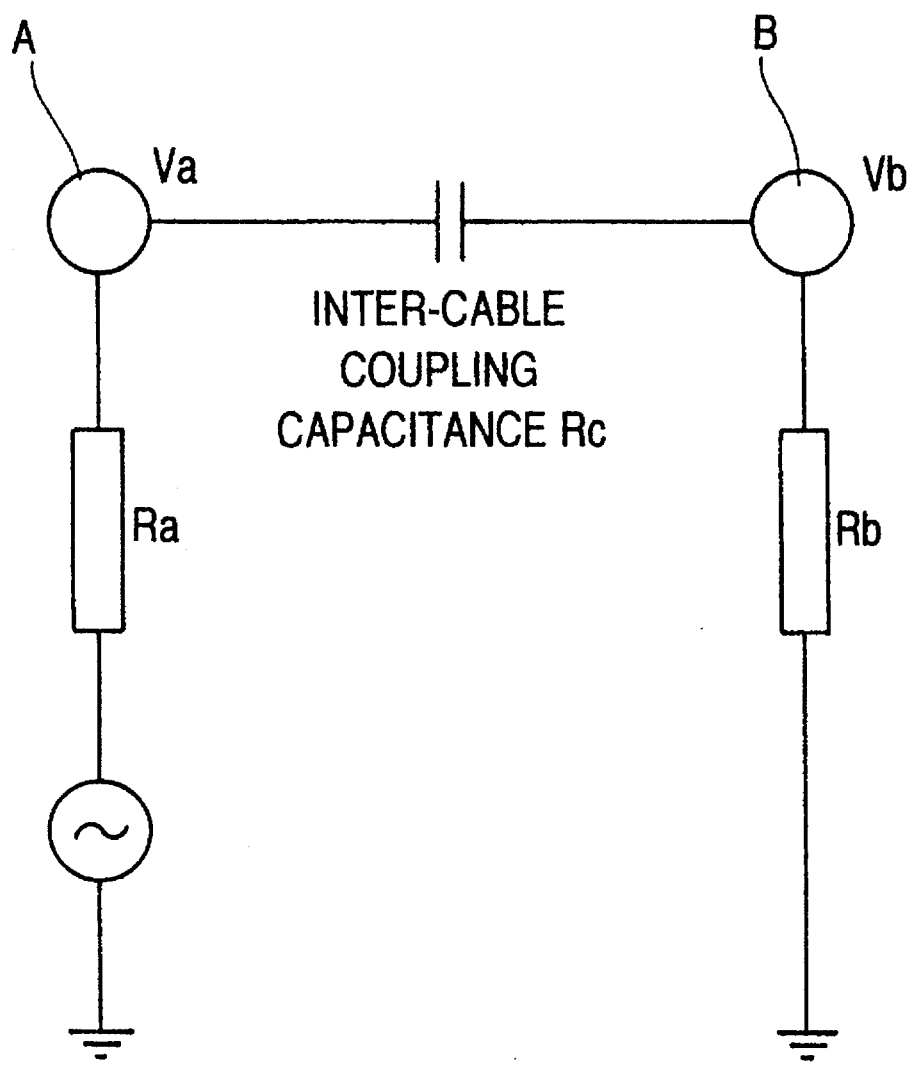
FIG. 16 shows an equivalent circuit between cables A and B which is set as an example to explain the influences exerted by an electrostatic coupling capacitance between the cables.

FIG. 16 shows the equivalent circuit which involves cables A and B set as an example to explain the influences exerted by the electrostatic coupling capacitance among the cables. In this example, the impedance of the electrostatic coupling capacitance between cables A and B is denoted as Rc, and the impedances between cables A and B and the earth via the applying circuit are denoted as Ra and Rb, respectively.

Thus, the signal voltage applied to cable A is Va and the signal voltage Va exerts influences on cable B via the coupling capacitance between cables A and B. If the signal voltage of cable B is denoted as Vb, then Vb can be determined by:

$$Vb = Va \cdot Rb/(Rb + Rc)$$

In actual use, if Rc>>Rb, then Vb<<Va. This means that if the impedance among the cables is sufficiently small, then the influences exerted by the coupling capacitance among the cables will be small enough to be ignored.

Hence, in this embodiment, the signal applying section applies three types of frequency signals in different combinations out of the six different frequency signals, which are usually very unlikely to be used at the same time, to each of the cables, and the signal detecting section close to the cable detects the frequency signals. Thus, in this embodiment, a plurality of cables can be efficiently identified without making erroneous judgment, permitting higher reliability of identifying cables.

Further in this embodiment, the signal detecting section is formed by electrostatic coupling with respect to the cables, and therefore, the same effect as that in the first embodiment will be acquired. Moreover, in this embodiment, the work for attaching identifying labels to the cables is no longer necessary, allowing cables to be easily identified by a single worker.

The display circuit in this embodiment can be considered in various configurations. For example, a configuration is considered wherein outputs of the signal processing circuits are supplied to a particular decoder circuit and the number of a channel, the output thereof has become "1" through the decoder, is displayed on a LCD panel. This allows the LCD panel to directly display the number of the cable by this channel number.

Incidentally, in an actual trough, a few dozen of cables to be identified are usually present in an extremely disorderly manner and there is electrostatic coupling among the cables. And in some cases, the capacitance between adjoining cables is larger than the capacitance which exists between the signal electrode of the detecting section and a particular cable to be identified. In such a case, in the identifying method of the first embodiment described above, the influence exerted by the capacitance between the cables causes an applied signal to be detected also from a cable adjacent to the particular cable. This makes it impossible to detect the particular cable out of the cables to be identified.

To solve such a problem, the third embodiment according to the present invention shows an identifying method which is not influenced by the capacitance between cables when identifying a particular cable.

FIG. 17 through FIG. 22 show the principle diagrams of typical three different situations and their equivalent circuits assumed to explain the principle of the embodiment. Referring to these drawings, the influences exerted by the capacitance among cables will be theoretically analyzed. In FIG. 17 through FIG. 22, the same parts as those of FIG. 1 are shown by the same reference characters for the convenience of explanation.

Figure 17:
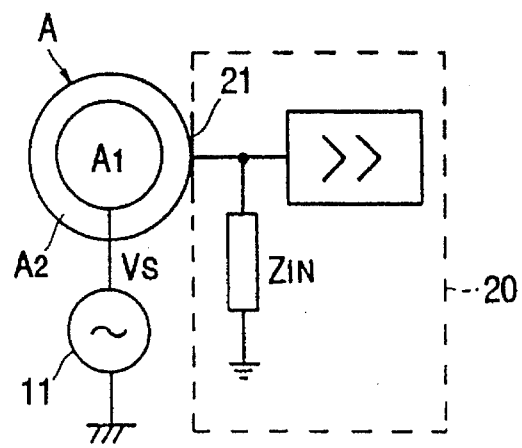
FIG. 17.
Figure 18:
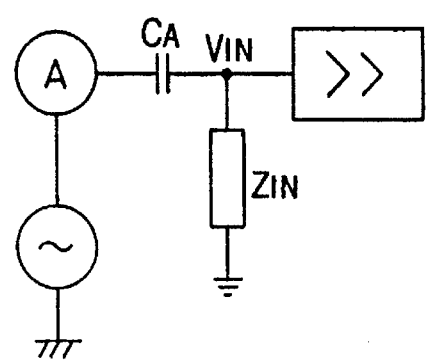
FIG. 18 are principle diagrams of a typical situation used to explain the principle of the third embodiment of the method for identifying objects to be identified according to the present invention and its equivalent circuit.
Figure 19:
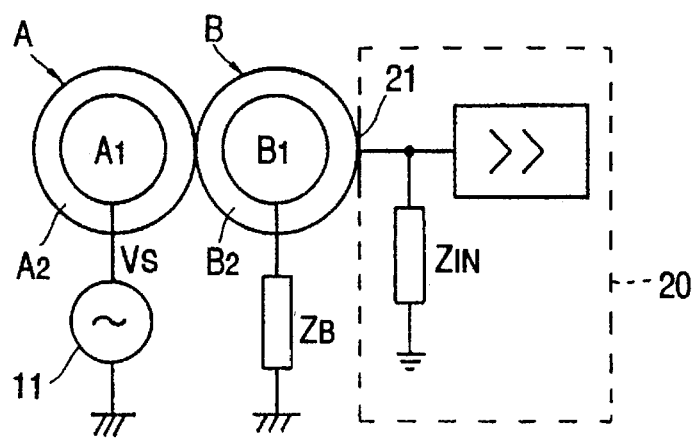
FIG. 19.
Figure 20:
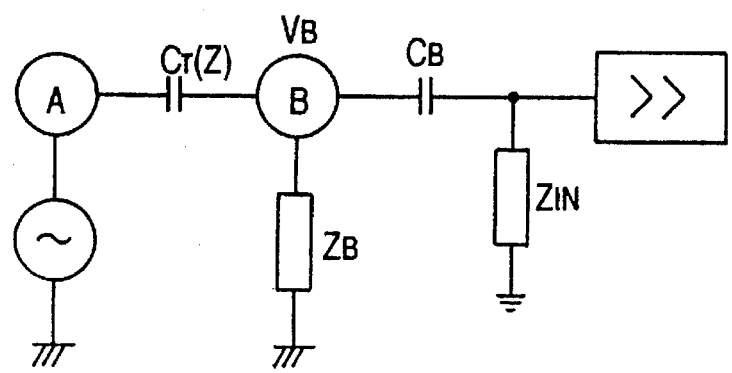
FIG. 20 are also principle diagrams of another typical situation used to explain the principle of the third embodiment and its equivalent circuit.
Figure 21:
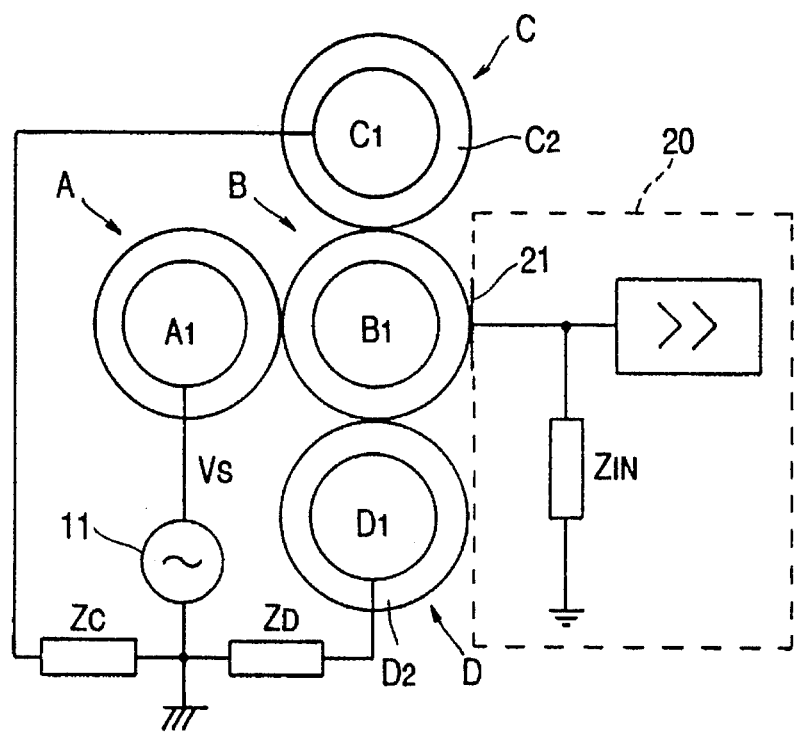
FIG. 21.

Referring to FIG. 17 through FIG. 22, A through D are the cables to be identified and cable A is the particular cable to be identified. FIG. 17, FIG. 19, and FIG. 21 show the cross-sectional views of cables A through D. Cables A through D are comprised of conductors A1 through D1 and shielding layers A2 through D2. These cables A through D are supposed to be laid in parallel against each other lengthwise. In all these drawings, all the coupling capacitances between adjoining cables are denoted as $C_T$ and the impedances as Z likewise for simplicity for the convenience of explanation.

First, a case wherein particular cable A is detected in FIG. 17 and FIG. 18 will be explained.

Referring to FIG. 17, the earthed oscillating circuit section 11 directly applies a potential signal of a given voltage (hereinafter referred to as "voltage signal"), e.g., signal voltage Vs, to conductor A1 of particular cable A. The detecting section 20 utilizes the electrostatic coupling capacitance $C_A$ between conductor A1 of cable A and the signal electrode. 21 to detect the voltage signal. In this case, the impedance of the coupling capacitance $C_A$ is denoted as $Z_{CA}$, an input impedance of the detecting circuit 22 to be discussed later is denoted as $Z_{IN}$, and the detection voltage of the voltage signal is denoted as $V_{IN}$. If $Z_{IN} << Z_{CA}$ to actually prevent $V_{IN}$ from being saturated, then the detection voltage $V_{IN}$ is determined by the following formula from the equivalent circuit shown in FIG. 18:

$$V_{IN} = Vs \cdot Z_{IN}/(Z_{IN} + Z_{CA}) \qquad (3)$$
$$= Vs \cdot Z_{IN}/Z_{CA}$$

The detecting section 20 determines whether a cable is particular cable A at the level of the signal voltage of three different frequencies (hereinafter referred to as "frequency signal") which are contained in a detected signal. In other words, it determines whether the cable is particular cable A according to the magnitude of the detection voltage $V_{IN}$.

One of the important conditions to make the signal voltage Vs sufficiently high is that none of conductor A1 of particular cable A, shielding layer A2, and the armor are earthed. This is because the signal potential level of cable A would approximate to zero due to the influence of an internal impedance (normally approximately 50Ω) of the oscillating circuit section 11 unless the conductive part to which the signal voltage Vs is applied is isolated from the earth. As a result, detection voltage $V_{IN}$ would also approximate to zero, making it impossible to identify particular cable A.

Next, a case will be explained wherein particular cable A and cable B, which has a large coupling capacitance, are identified in FIG. 19 and FIG. 20.

Referring to FIG. 19, cable B is adjacent to particular cable A and it is earthed, with its impedance denoted as $Z_B$. In this equivalent circuit shown in FIG. 20, the electrostatic coupling capacitance between conductor B1 of cable B and the signal electrode 21 is denoted as $C_B$ and the impedance as $Z_{CB}$. The detection voltage $V_{IN}$ in this case is determined by the following formula (utilizing $Z_{IN} \ll Z_{CB}$):

$$V_{IN} = [Z_B \cdot Z_{CB}/\{Z(Z_B + Z_{CB}) + Z_B \cdot Z_{CB}\}] \cdot [V_S \cdot Z_{IN}/Z_{CB}] \quad (4)$$

Impedances Z and $Z_{CB}$ depend on the arrangement of cables in a trough and they cannot be changed artificially. Hence, the value of detection voltage $V_{IN}$ greatly varies according to impedance $Z_B$. A cable in service is earthed, and therefore, it is obvious that impedance $Z_B \ll Z_{CB}$ and $Z_B \ll Z$. Detection voltage $V_{IN}$ determined in formula (4) can be simplified as follows:

$$V_{IN} = (Z_B/Z) \cdot (V_S \cdot Z_{IN}/Z_{CB}) \quad (5)$$

$V_{IN}$ of formula (5) $\ll V_{IN}$ of formula (3); therefore, even if the signal electrode 21 touches cable B, the detecting section 20 can securely distinguish particular cable A from cable B because detection voltage $V_{IN}$ from cable B is extremely low.

One of the important conditions to make the detection voltage $V_{IN}$ of the cables other than the particular cable sufficiently low is to securely earth the oscillating circuit section 11. This is because impedance $Z_B$ contains the impedance between the oscillating circuit section 11 and the earth. If the oscillating circuit section 11 were not earthed, then detection voltage $V_{IN}$ would be generated each time the signal electrode 21 touches a cable.

Thus, in the case discussed above, detection voltage $V_{IN}$ is generated because impedance $Z_B$ approximates to infinity and the cables in a trough are extremely long, causing the coupling capacitance among the cables to grow sufficiently larger than electrostatic coupling capacitance $C_B$. The result is $Z_B \gg Z$, $Z_B \gg Z_{CB}$, $Z \ll Z_{CB}$, and detection voltage $V_{IN}$ of formula (4) can be simplified as follows:

$$V_{IN} = V_S \cdot Z_{IN}/(Z_{CB} + Z_{IN}) \quad (6)$$
$$= V_S \cdot Z_{IN}/Z_{CB}$$

The value of $V_{IN}$ of formula (6) is approximately the same as that of $V_{IN}$ of formula (3). Hence, the particular cable cannot be identified.

A case will now be described wherein particular cable A is identified when cable B is not in service. In this case, when the trough has two cables, A and B, in it, impedance $Z_B$ shown in FIG. 19 and FIG. 20 approximates to infinity. This is the same situation as that represented in formula (6); therefore, it is difficult to securely distinguish cable A from cable B. To avoid this, the conductor of cable B is earthed to approximate impedance $Z_B$ to zero. Thus, detection voltage $V_{IN}$ from cable B also approximates to zero, making it easy to distinguish particular cable A from cable B. Accordingly, in this case also, one of the important conditions to make detection voltage $V_{IN}$ of cable B not in service other than the particular cable sufficiently low is to earth cable B.

Actual situations are, however, more complicated and there are a dozen of cables in a trough, most of them being in service. It is also not easy to earth all cables that are not in use. To solve such a problem, according to the present invention, the situation of an embodiment shown in FIG. 21 and FIG. 22 will be discussed. In this embodiment, there are cables A and B, which are not used, in the trough, and the two cables are arranged side by side, both having large coupling capacitances. It is assumed that cables C and D, which exist around cables A and B, are all in service. Under such a condition, it is assumed that the impedance between cable C and the earth is expressed as $Z_C$ and the impedance between cable D and the earth is expressed as $Z_D$, and the coupling capacitance between cables B and C, and between cable B and D is expressed as $C_T$, the impedance being expressed as Z.

Figure 22:
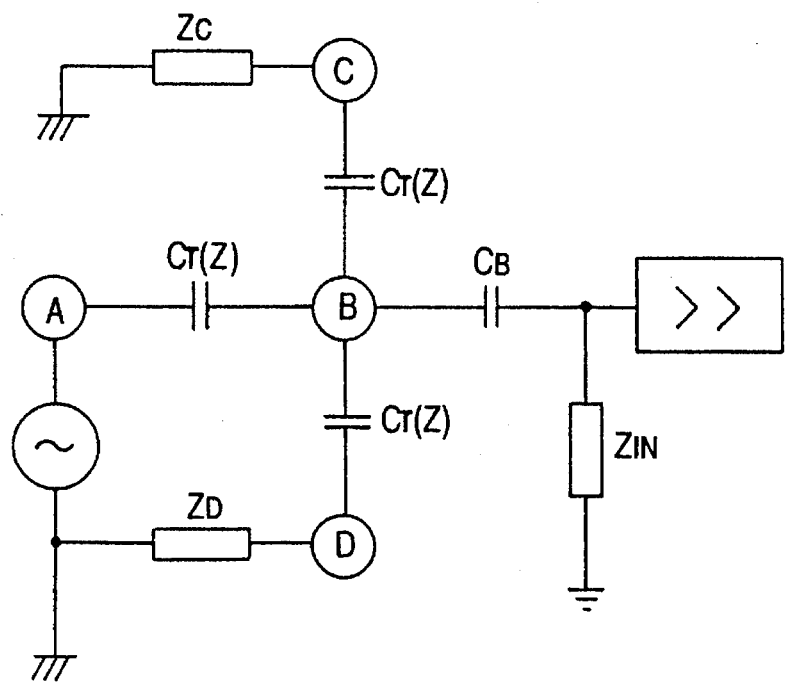
FIG. 22 are also a principle diagram of still another typical situation used to explain the principle of the third embodiment and its equivalent circuit.

In this case, in the equivalent circuit shown in FIG. 22, cables C and D in service will have $Z_C \ll Z$, $Z_D \ll Z$, and impedances $Z_C$ and $Z_D$ are ignorable; therefore, the relationship between voltage $V_B$ of cable B and signal voltage $V_S$ and the relationship between detection voltage $V_{IN}$ and signal voltage $V_S$ will be as shown below:

$$V_B = V_S \cdot Z_{CB}/(Z + 3Z_{CB}) \quad (7)$$

$$V_{IN} = V_S \cdot \{Z_{CB}/(Z + 3Z_{CB})\} \cdot Z_{IN}/Z_{CB} \quad (8)$$
$$= V_S \cdot Z_{IN}/(Z + 3Z_{CB})$$

Formula (3) and formula (8) have proven that the level of detection voltage $V_{IN}$ from cable B is one third or less of the level of detection voltage $V_{IN}$ from the particular cable. Hence, even if cable B not in service is not earthed, the level of detection signal $V_{IN}$ from cable B is one third or less of the level of detection signal $V_{IN}$ from the particular cable because of the influences of the surrounding cables in service; in this case, appropriately adjusting the sensitivity of the detecting section 20 makes it possible to identify particular cable A.

Figure 23:
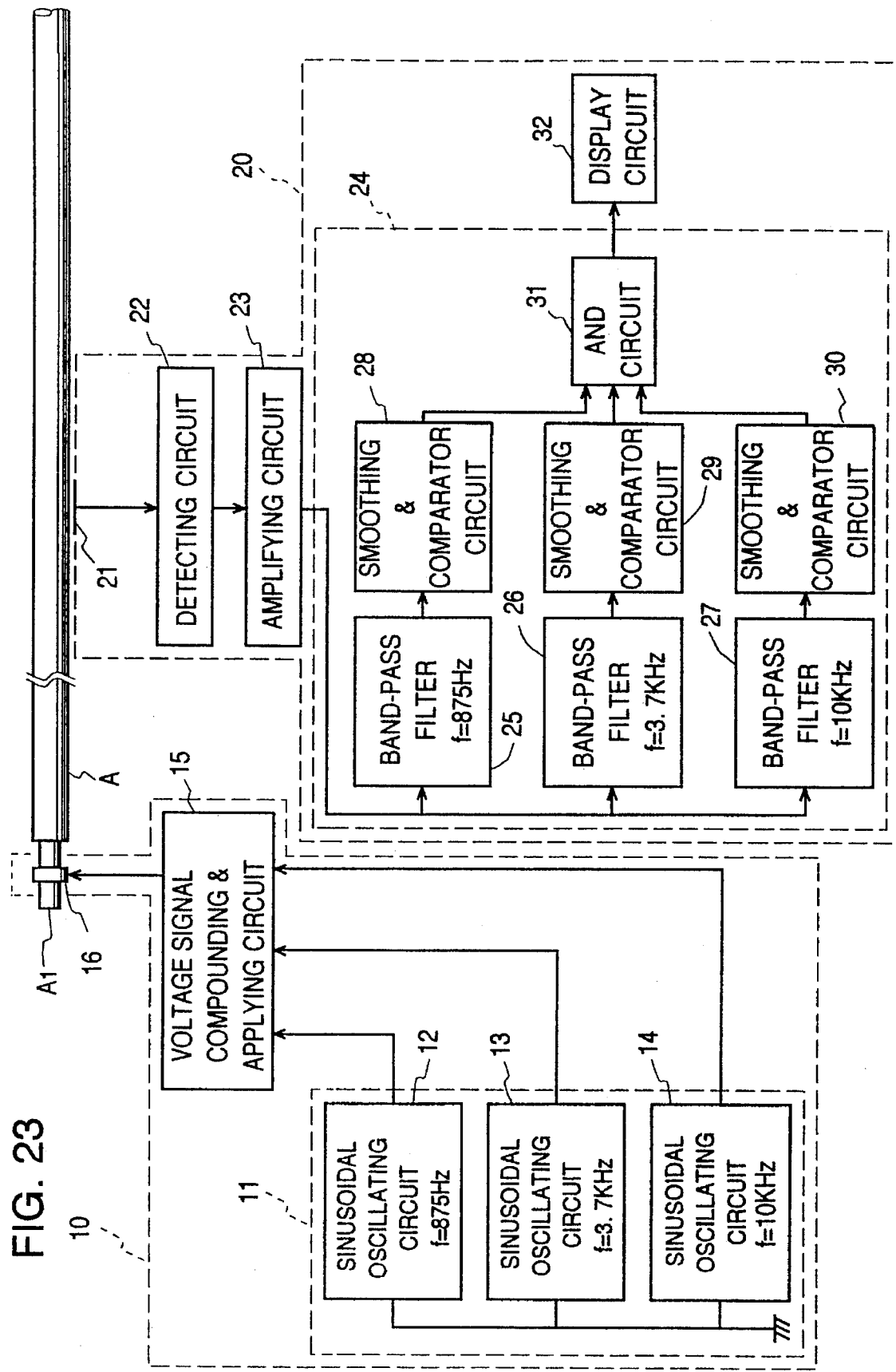
FIG. 23 is a block diagram which shows the configuration of an identifying apparatus which employs the third embodiment.

Based on this verification, in the present invention, when a particular cable is identified using, for example, an electrostatic coupling type cable identifying apparatus shown in FIG. 23, the following conditions will be used:

(1) A cable to be removed is isolated from a connection terminal or the earth.

(2) If there is a cable not in use in an oscillating circuit or a trough to work on, then the shielding layer of the cable (the conductors of the bundled cables if there is no shielding layer) is earthed.

(3) However, if there is any special situation, then a particular cable will be identified by adjusting the sensitivity of the detecting section to be discussed later without earthing.

FIG. 23 is the block diagram which shows the configuration of an identifying apparatus which employs the third embodiment of the cable identifying method according to the present invention as described above. In FIG. 23, the same parts as those shown in FIG. 1 use the identical reference characters for the convenience of explanation.

In the diagram, particular cable A is comprised of shielding layer A2 and conductor A1 which is insulated with the shielding layer A2 and it is isolated from the earth in accordance with condition (1). Likewise, the cables other than particular cable A, which are present in the trough, are earthed in accordance with condition (2) when they are not in service.

The identifying apparatus consists of the signal applying section 10, which applies a frequency signal of a particular frequency to conductor A1 of particular cable A, and the detecting section 20 which detects the signal voltage of the applied frequency signal in contact or not in contact with housed particular cable A through an opened cover of the trough at any distance from the signal applying section 10, thereby identifying the cable.

The signal applying section 10, as in FIG. 1, is comprised of sinusoidal oscillating circuits 12 through 14 consisting of the oscillating circuit 11, the voltage signal compounding & applying circuit 15 which compounds these frequency signals and applies the resultant voltage signal to conductor A1 of particular cable A, and the clip 16 which is attached to conductor A1 and which applies the voltage signal from the voltage signal compounding & applying circuit 15 to conductor A1. In this case, the clip 16 may be connected to shielding layer A2.

The sinusoidal oscillating circuits 12 through 14 are earthed in accordance with condition (2) and generate three different sinusoidal frequency signals of, for example, 875 [Hz], 3.7 [kHz], and 10 [kHz] which are normally not used much.

The detecting section 20 is comprised of the detecting circuit 22, the amplifying circuit 23 which amplifies a voltage signal and allows the amplifying gain to be adjusted in accordance with condition (3), the signal identifying circuit 24 which identifies particular cable A from the amplified voltage signal, and the display circuit 32.

The amplifying circuit 23 amplifies a voltage signal to cope with a change in the magnitude of the voltage signal detected by the detecting circuit 22. The amplifying circuit 23 has another important function; it is to locate a particular cable out of a dozen cables that are present in the same trough, and the amplifying circuit 23 is designed to permit the adjustment of gain (the adjustment of sensitivity) for accomplishing the function.

The sensitivity is a judgment standard for the level of detection signal $V_{IN}$, and the higher the sensitivity, the lower the required signal level of detection signal $V_{IN}$. In other words, the sensitivity indicates the greatest distance from which the signal electrode 21 can accurately identify particular cable A. In the case of specific practical equipment, if the sensitivity is high, then the detection signal is generated even when the signal electrode 21 is slightly away from particular cable A, thus making it possible to identify particular cable A without the need of adjusting the sensitivity. However, as shown in condition (3), if a cable not in service exists and if the cable can not be earthed, then it may be impossible to distinguish the cable not in use from the particular cable. For this reason, it is essential to properly adjust the sensitivity of the amplifying circuit 23 in accordance with condition (3).

As a sensitivity adjusting mechanism for the amplifying circuit 23, the following two embodiments, for example, are conceivable:

(Embodiment 3-1)

A sensitivity adjusting mechanism is considered, wherein a control knob for continuously adjusting the detection sensitivity is provided and the sensitivity level which is set through this control knob is continuously displayed on an LCD panel. In this example, when the panel shows that the sensitivity has been set, for example, to 0.3 V, if the level of a detected signal exceeds 0.3 V, then a specified visual or audio detection signal, for example, is given.

(Embodiment 3-2)

Another example is considered, wherein the sensitivity is adjusted in rotary steps. In this example, the sensitivity is ranked into 1 to 6, for instance, and the signal levels for generating the detection signals are set to 0.3 V, 0.6 V, 1.2 V, 2.4 V, 4.8 V, and 9.6 V according to the six ranks to detect signals.

The signal identifying circuit 24 is comprised of the similar band-pass filters 25 through 27, smoothing & comparator circuits 28 through 30, and the AND circuit 31 to those shown in FIG. 1, and it performs the similar operation to that shown in FIG. 1.

The following presents detailed description of a method for adjusting the sensitivity by using the sensitivity adjusting mechanism of Embodiment 3-2.

First, the signal voltage is applied to the particular cable through the signal applying section 10, then the sensitivity adjustment of the amplifying circuit 23 of the detecting section 20 is performed. In this case, the adjustment should be carried out in the vicinity of the signal voltage applying place where it is possible to determine whether the cable with which the signal electrode 21 is in contact is particular cable A.

The first step of this sensitivity adjusting procedure is to set the sensitivity to rank 1 and bring the signal electrode 21 into contact with all cables.

If the detecting section 20 issues no detection signal for any of the cables, then the voltage applied to particular cable A and isolation from the earth are examined. Or, if the detection signal generated from the detecting section 20 is only for particular cable A, then the sensitivity is set to rank 3 and contact is made to particular cable A.

If the detecting section 20 issues a detection signal, then it means that the sensitivity is appropriate; therefore, the sensitivity adjustment is terminated. Or, if no detection signal is produced, then the sensitivity adjustment is continued by raising the sensitivity rank until the detection signal is issued.

If the detecting section 20 issues the detection signal for more than one cable, it indicates that the cable or cables other than particular cable A are not in service and are not earthed. In this case, the sensitivity rank is lowered until the detecting section 20 generates the detection signal only for particular cable A to begin with. For instance, if the then rank is 3, the sensitivity rank is lowered further by two ranks to 5 before checking whether the detecting section 20 issues the detection signal for particular cable A.

If it has been proved that the particular cable can be identified by the detecting section 20, the sensitivity adjustment is finished. If any particular cable cannot be identified, then the conductive portion or portions of a cable or cables not in service are securely earthed.

After finishing the work described above, particular cable A is identified in a desired trough; the cables, which are present in the trough, are checked one by one to locate particular cable A. This eliminates the need of checking all the cables one by one, resulting in a dramatically reduced work time.

Thus, in this embodiment, the signal voltage is applied by the earthed signal applying section to the unearthed particular cable and the signal voltage is detected by the electrostatically detecting section with its gain adjusted. Therefore, in this embodiment, the signal voltage is not detected from any cables other than the particular cable, permitting accurate identification of the particular cable without suffering from erroneous judgment.

As described above, the sensitivity of the detecting section for locating a particular cable can be increased by increasing the gain of the amplifying circuit 23, however, the present invention is not limited to that; alternatively, for instance, the threshold value levels of the reference signals of the smoothing & comparator circuits 28 through 30 may be adjusted, namely, lowered to increase the sensitivity.

Next, the signal levels of the cables that are present in an actual trough are detected, an example of detection results being shown in the following Table 1 through Table 3. Table 1 through Table 3 show the signal levels which have been detected from four cables including the particular cable in a place where the particular cable is laid. Specifically, Table 1 shows the measurement results obtained in the vicinity of the signal applying spot, Table 2 shows the measurement results obtained at a terminal box located approximately 560 m away, and Table 3 shows the measurement results obtained in a trough which is approximately 560 m away.

TABLE 1

|  | Signal Level [V] | | |
| --- | --- | --- | --- |
|  | 875[Hz] | 3.7[KHz] | 10[kHz] |
| Particular Cable | 5.7 | 8.4 | 7.7 |
| Cable 1 | 1.2 | 2.3 | 6.4 |
| Cable 2 | 0.1 | 0.4 | 1.2 |
| Cable 3 | 1.2 | 2.0 | 4.6 |

TABLE 2

|  | Signal Level [V] | | |
| --- | --- | --- | --- |
|  | 875[Hz] | 3.7[KHz] | 10[kHz] |
| Particular Cable | 2.1 | 2.8 | 2.4 |
| Cable 4 | 1.9 | 0.6 | 0 |
| Cable 5 | 1.0 | 0.1 | 0 |
| Cable 6 | 0.5 | 0.1 | 0.3 |

TABLE 3

|  | Signal Level [V] | | |
| --- | --- | --- | --- |
|  | 875[Hz] | 3.7[KHz] | 10[kHz] |
| Particular Cable | 7.0 | 7.0 | 5.0 |
| Cable 7 | 0.3 | 0 | 0 |
| Cable 8 | 2.2 | 2.0 | 0.1 |
| Cable 9 | 1.6 | 0.8 | 0 |

As it is obvious from the detection results, the absolute values of the signal levels detected from the particular cable significantly vary depending on the detection spot.

Such variation is considered due to the difference in the distance between the signal electrode and the conductor of the particular cable, the difference in the dielectric constant of intermediate materials or the like. As a result, in such a case, it becomes necessary to adjust the sensitivity (the magnitude of the threshold value of the comparator circuit) for each detection spot. It is possible to identify the particular cable by adjusting the sensitivity, however, the sensitivity adjustment may adversely affect the reliability which must be high in this identifying method.

To solve such a problem, in the fourth embodiment, an identifying method is provided, wherein a particular cable requiring no sensitivity adjustment can be identified even when the signal level of the particular cable in the trough changes. In this embodiment, three types of frequency signals (875 [Hz], 3.7 [kHz], and 10 [kHz]) sharing the same amplitude are compounded and applied as the voltage signal to the particular cable.

The influences exerted by the capacitance among the cables will now be explained theoretically. The proportional relationship of the signal levels of the frequency signals detected from the particular cable shown in Table 1 obviously differs from the proportional relationship of the signal levels of the frequency signals detected from other cables 1 through 3. More specifically, referring to Table 1, the signal levels of the three channels detected from the particular cable are almost the same, while the signal levels detected from other cables significantly vary.

When the signal levels, 875 [Hz], 3.7 [kHz], and 10 [kHz], are taken as V1 [V], V2 [V], and V3 [V], the trend of the variations will be:

$$V1\ [V] < V2\ [V] < V3\ [V] \tag{9}$$

Theoretically, the cause for the different proportional relationships can be explained as set forth below. The signal voltage is directly applied to the particular cable; therefore, the proportional relationship of the levels of the frequency signals which the detecting section detects from the particular cable is nearly the same as the proportional relationship of the frequency signals before the oscillating section compounds the signals. In contrast with this, the levels of the frequency signals induced in the cables other than the particular cable depend on a potential dividing relationship shown below:

$$V_Y = Z_{AC} \cdot V_S / (Z_{AC} + Z_{CC}) \tag{10}$$

where $V_Y$: Level of the voltage signal induced in other cable $V_S$: Level of the voltage signal applied to the particular cable $Z_{AC}$: Impedance of other cable against the earth (Impedance of the capacitance)

$Z_{CC}$: Impedance between other cable and the particular cable (Impedance of the capacitance)

The capacitance between other cable and the particular cable is relatively stable and nearly identical capacitance is given for the 10 [kHz] signal.

The capacitance impedance between other cable and the earth is considered to tend to increase as the signal frequency increases. As a result, the phenomenon shown in formula (9) takes place.

If $Z_{AC} \ll Z_{CC}$, then $V_Y \ll V_S$ and the signal level detected will be 0 [V] or extremely low. Referring now to Table 2 and Table 3, the data on the signal levels detected from other cables 4 through 9 indicate different variations. Some of the data, however, include those, the signal levels thereof are 0 [V] or extremely low. The cause for such data to have been detected is considered due to noises rather than induced signals. When detecting the particular cable, it is almost impossible that the three specific frequency noises exist in other cables at the same time. Hence, of the three channels of the signal levels, at least one has a value which is approximate to 0 [V]. This can be found even by the identifying method of the first embodiment discussed above.

Referring to Table 1, however, the data on the signal levels detected from other cables 1 through 3 shows no signal level which is 0 [V] or extremely low. The fourth embodiment shows a method which allows a particular cable to be identified even in the case shown in Table 1.

Figure 24:
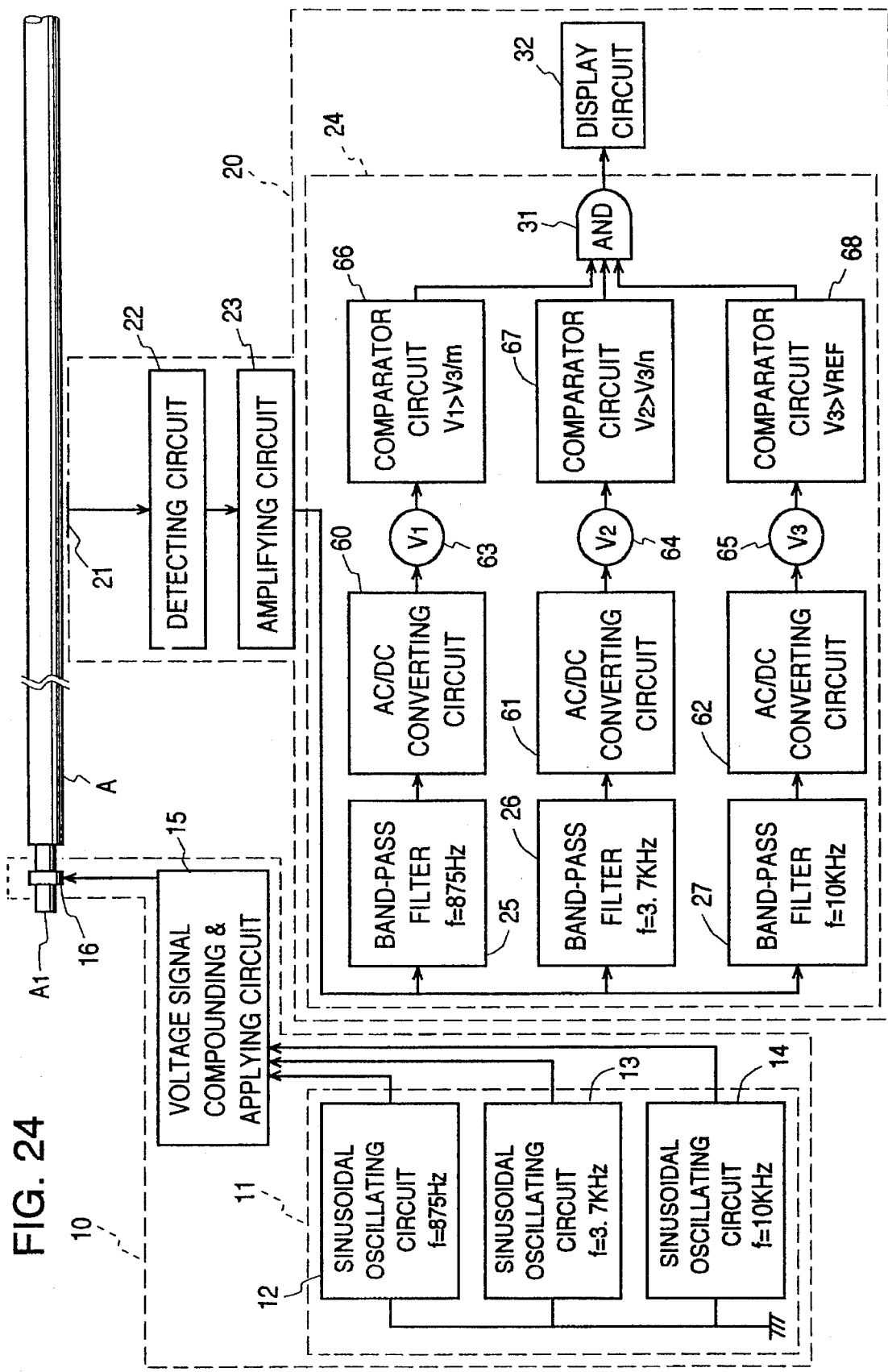
FIG. 24 is a block diagram which shows the configuration of an identifying apparatus which employs the fourth embodiment of the method for identifying objects to be identified according to the present invention.

FIG. 24 is a block diagram which shows the configuration of the cable identifying apparatus which employs the fourth embodiment of the method for identifying an object to be identified according to the present invention. In FIG. 24, the like parts are shown by the same reference characters as in the first embodiment of FIG. 1, and detailed explanation will be omitted.

Referring to FIG. 24, the cable identifying apparatus is comprised of the signal applying section 10, which applies a frequency signal of a specific frequency to conductor A1 of particular cable A sheathed with an insulator, and the detecting section 20 which detects the signal voltage of the applied frequency signal in contact or not in contact with particular cable A at a point away from the signal applying section 10, thereby identifying the cable.

As in the first embodiment, the signal applying section 10 is comprised of the oscillating circuit section 11 consisting of the sinusoidal oscillating circuits 12 through 14, the voltage signal compounding & applying circuit 15, and the clip 16, and the sinusoidal oscillating circuits 12 through 14 are all earthed and they generate three channels of sinusoidal frequency signals of 875 [Hz], 3.7 [kHz], and 10 [kHz].

As in the first embodiment, the detecting section 20 is comprised of the signal electrode 21, the detecting circuit 22, the amplifying circuit 23, the signal identifying circuit 24, and the display circuit 32.

The signal identifying circuit 24 is comprised of the band-pass filters 25 through 27 and the AND circuit 31, which are similar to those in the first embodiment, and also AC/DC converting circuits 60 through 62, DC voltage meters 63 through 65, and comparator circuits 66 through 68 which are provided corresponding to the band-pass filters 25 through 27.

The AC/DC converting circuits 60 through 62 subject the frequency signals of the three channels, which have passed through the band-pass filters 25 through 27, to AC/DC conversion and supply the results to the corresponding DC voltage meters 63 through 65.

The DC voltage detection meters 63 through 65 detect the voltage values V1, V2, and V3 of the signals, which have been converted through the converting circuits 60 through 62, and supply them to the corresponding comparator circuits 66 through 68. To be specific, the DC voltage meter 63 detects the voltage value V1 of the frequency signal having a frequency of 875 [Hz], the DC voltage meter 64 detects the voltage value V2 of the frequency signal having a frequency of 3.7 [kHz], and the DC voltage meter 65 detects the voltage value V3 of the frequency signal having a frequency of 10 [kHz].

The comparator circuits 66 through 68 compare the voltages V1, V2, and V3 of the frequency signals, which have undergone the DC signal conversion, with specified voltages. More specifically, the comparator circuits 66 through 68 determine whether the voltages V1, V2, and V3 of the frequency signals are higher or lower than the specified threshold value levels that are preset in the circuits 66 through 68. If the frequency signals are larger than the reference signals, then the comparator circuits 66 through 68 set the outputs supplied to the AND circuit 31 to "1".

As in the first embodiment, if the outputs from the three comparator circuits 66 through 68 are all "1", then the AND circuit 31 sets its output to "1". When the output of the AND circuit 31 is "1", the display circuit 32 indicates that the cable to which the signal electrode 21 is approximate is particular cable A to which the frequency signal has been applied.

The following describes judgment standards for particular cables in the signal identifying circuit 24, i.e., the standards for setting threshold values in the comparator circuits 66 through 68.

First, the threshold values in the comparator circuits 66 through 68 are established quantitatively and qualitatively as shown below by utilizing the trend of the variations in the signal levels of the three channels discovered in experiments. In this example, the setting standards for the threshold values in the comparator circuits 66 through 68 are established as follows:

$$V1\ [V] > V3\ [V]/m \tag{11}$$

$$V2\ [V] > V3\ [V]/n \tag{12}$$

$$V3\ [V] > V_{REF} \tag{13}$$

where m, n: Specific proportional constants $V_{REF}$: Preset minimum reference signal level Inequalities (11) and (12) may be said to be qualitative judgment standards which are determined by a mutual proportional relationship of the three channels of signal levels, V1, V2, and V3. Although inequality (13) is a quantitative judgment standard, the objective of establishing this standard is to provide a measure against noises.

In this embodiment shown in FIG. 24, for instance, the "m" and "n" are set to 2, with $V_{REF}$ set to 0.5 [V], and only when all three inequalities (11) through (13) are satisfied, a cable is identified as the particular cable.

Under the condition, the signal levels detected from the cables shown in Table 1 will be verified. In this case, the signal levels detected from a particular cable by the detecting section 20 satisfy inequalities (11) through (13) set in all the comparator circuits 66 through 68 of the signal identifying circuit 24, but the signal levels detected from other cables 1 through 3 do not satisfy the inequalities. Further, according to the verification results on the cables shown in Table 2 and Table 3, as in the case with Table 1, only the signal levels detected from the particular cable satisfy inequalities (11) through (13) and the signal levels detected from other cables 1 through 3 do not satisfy the inequalities.

Hence, in this embodiment, the judgment standard of a particular cable in the signal identifying circuit is established in accordance with the mutual proportional relationship of the signal levels to identify the particular cable. In this embodiment, therefore, the particular cable can be securely distinguished from other cables, making it possible to eliminate the need of improper sensitivity adjustment which leads to poor reliability. Additionally, in this embodiment, a rotary switch for adjusting sensitivity is no longer necessary, resulting in reduced manufacturing cost.

In this embodiment, a particular cable was identified in accordance with a proportional relationship of signal levels, however, the present invention is not limited to this; the particular cable may be alternatively identified by a quantitative judgment standard. For instance, a uniform setting standard may be established for the threshold values in the comparator circuits 66 through 68 as shown below:

$$V1\ [V] > V_{REF} \tag{14}$$

$$V2\ [V] > V_{REF} \tag{15}$$

$$V3\ [V] > V_{REF} \tag{16}$$

And only if all three inequalities (14) through (16) are satisfied, a cable is identified as the particular cable. In this case, $VRE_F$ is set, for example, to about 1.5 [V].

In this case also, as shown in Table 1 through Table 3, the signal levels detected from the particular cable by the detecting section 20 satisfy inequalities (14) through (16) set in all comparators 66 through 68 of the signal identifying circuit 24, but the signal levels detected from other cables 1 through 9 do not satisfy these inequalities.

As another alternative, the setting references for the threshold values of the comparator circuits 66 through 68 may be established, for example, as follows:

$$V1 [V] > V2 [V]/n \quad (17)$$

$$V2 [V] > V3 [V]/n \quad (18)$$

$$V3 [V] > V_{REF} \quad (19)$$

And the particular cable can be identified in accordance with the qualitative judgment standard based on the mutual proportional relationship of the three channels of signal levels.

In brief, in these embodiments, the signal levels detected from the particular cable are almost the same, while the signal levels detected from the cables other than the particular cable exhibit significant variations.

Accordingly, in these embodiments, the signal levels and uniformity of detected frequency signals are determined, making it possible to accurately identify the particular cable out of a plurality of cables without being influenced by the capacitance among the cables.

In an actual trough, most cables other than the particular cable are in service and various frequency signals are transmitted. Those signals are all noises in identifying the particular cable. When the frequencies of the noises are nearly identical to the signal frequencies, it becomes extremely difficult to accurately identify the particular cable. In particular, when actually using the identifying method of the first embodiment, the frequency of the signal applied by the signal applying section to the particular cable may vary due to temperature drift and the like. To cope with this variation, the pass frequency band of the band-pass filter of the detecting section is slightly widened and its Q value is slightly decreased to make it easier for noises to pass through the band-pass filter.

Further, in the identifying method of the first embodiment, the threshold value of the three-channel comparator circuit is set. And it is determined whether a cable being detected is the particular cable by checking whether a signal level detected by the detecting circuit exceeds the threshold value of the comparator circuit. Specifically, in the identifying apparatus, which employs the first embodiment, the threshold values of the three channels are set using the rotary switch to provide fixed judgment standards used to check signal levels. Hence, if a large noise is added to a signal level detected by the detecting circuit, there is a danger of erroneous judgment, adversely affecting high reliability which is a must for such an identifying method.

To solve such a problem, the fifth embodiment shows an identifying method which eliminates the possibility of erroneous judgment of the particular cable caused by noise components, thereby assuring accurate identification of the particular cable among a plurality of cables. In this embodiment, three types of frequency signals (875 [Hz], 3.7 [KHz], and 10 [KHz]), which share the same amplitude, are compounded and applied as a voltage signal to the particular cable.

The influences exerted by noises will now be explained by utilizing actual signal waveforms. The cables used for this detection include, for example, an 8-core cable (particular cable), a 19-core cable, and a thin cable laid in a trough. To perform the detection, the signal electrode 21 of the detecting section 20 (see FIG. 30 to be discussed later) is brought close to these cables, and the output waveforms of the amplifying circuit 23 (the gain is approximately 1.5) are observed on an oscilloscope and recorded. The output waveforms thus obtained are shown in FIG. 25 to FIG. 29. It is assumed that the particular cable has its both ends completely isolated; the 19-core cable has its four cores in service and the remaining 15 cores independent; and the thin cable is in service.

Figure 25:
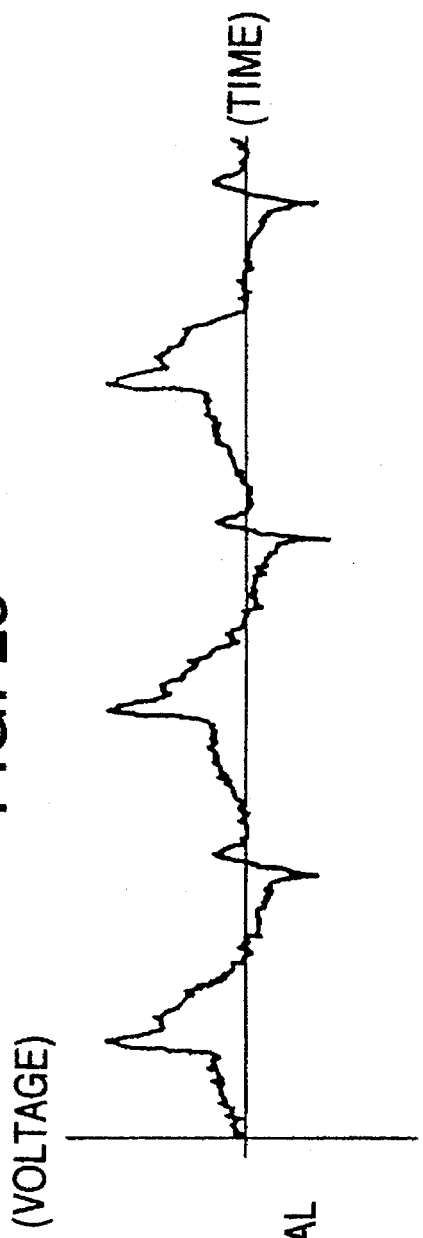
FIG. 25 is a chart which shows a signal waveform detected from an 8-core cable according to the fifth embodiment before a voltage signal is applied to the cable.
Figure 26:
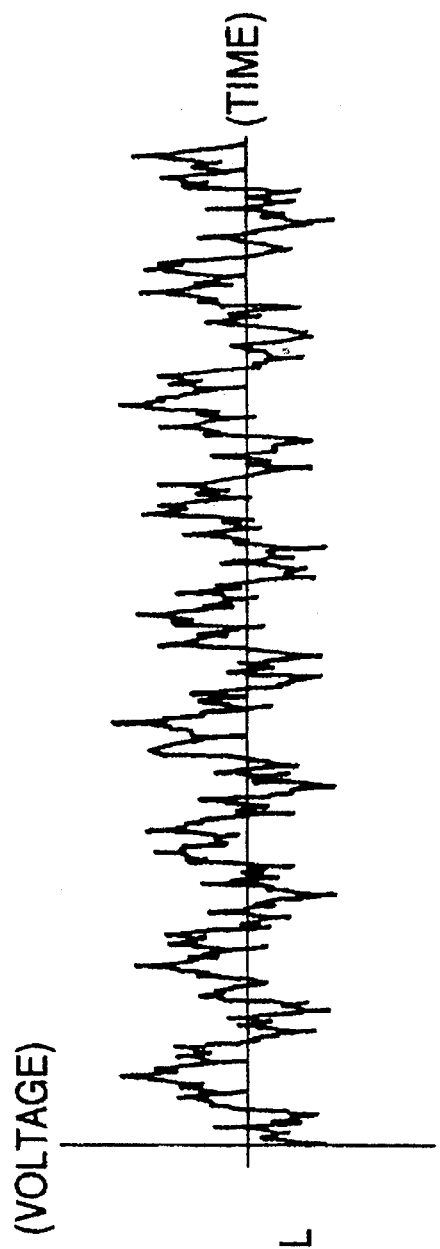
FIG. 26 is a chart which shows a signal waveform detected from the 8-core cable after the signal voltage was applied to the cable.

FIG. 25 shows a signal waveform (noise) detected from the particular cable before the voltage signal was applied to the particular cable. FIG. 26 shows a signal waveform detected from the particular cable after the voltage signal was applied to the particular cable. The observation results revealed a marked difference in noise level between the two waveforms. The noises in the surroundings of the field are short-circuited to a small output impedance of the oscillating section; therefore, the signal waveform shown in FIG. 26 seems to be a pure waveform of the compounded voltage signal.

Figure 27:
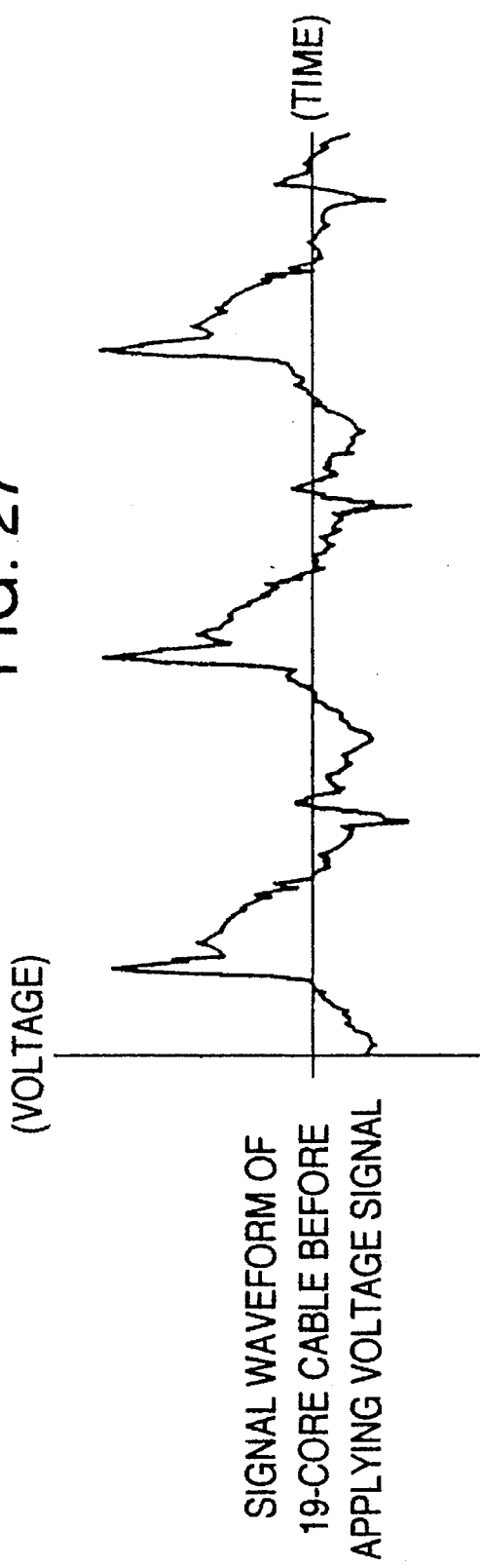
FIG. 27 is a chart which shows a signal waveform detected from a 19-core cable before the voltage signal is applied to the 8-core cable.
Figure 28:
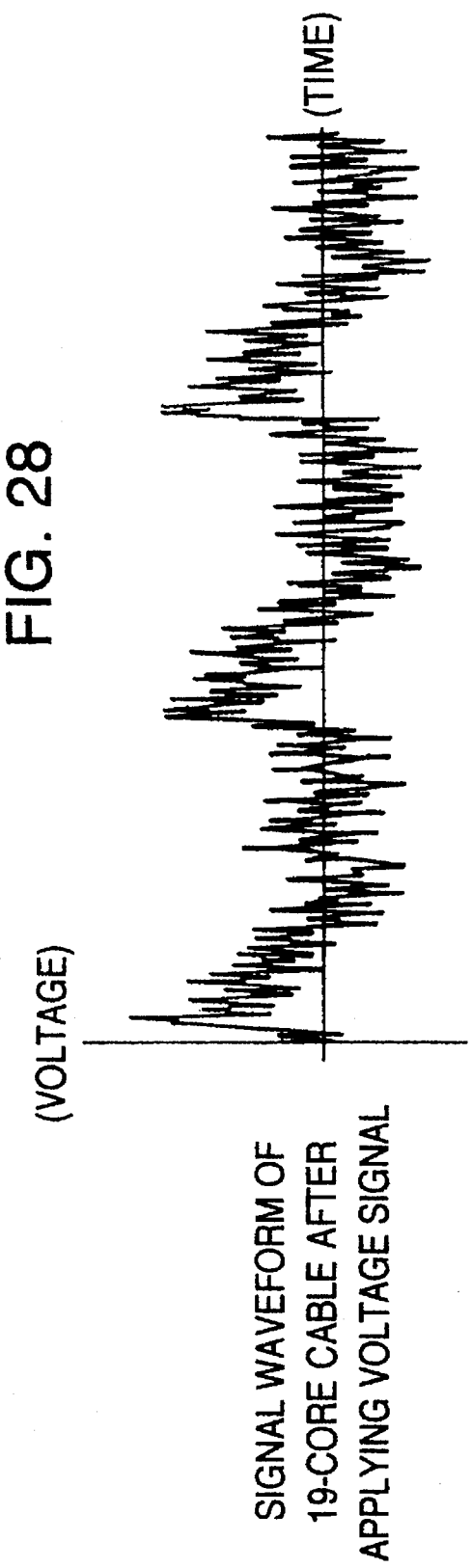
FIG. 28 is a chart which shows a signal waveform detected from the 19-core cable after the voltage signal was applied to the 8-core cable.

FIG. 27 shows a signal waveform (noise) detected from the 19-core cable before the voltage signal was applied to the particular cable. FIG. 28 shows a signal waveform detected from the 19-core cable after the voltage signal was applied to the particular cable. Judging from the observation results, the noise levels of the two waveforms are almost the same. The signal waveform shown in FIG. 28 seems to be the noise waveform shown in FIG. 27 onto which a signal waveform has been slightly superimposed. This means that the impedance of the 19-core cable against the ground is high.

Figure 29:
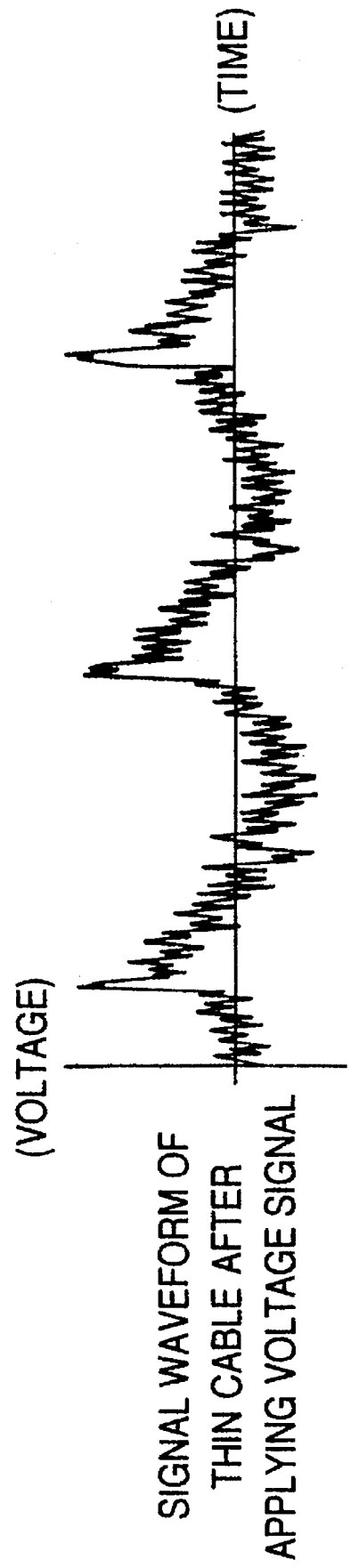
FIG. 29 is a chart which shows a signal waveform detected from a thin cable after the voltage signal was applied to the 8-core cable.

FIG. 29 indicates a signal waveform detected from the thin cable after the voltage signal was applied to the particular cable. In the waveform, the applied signal, which was induced onto the noise waveform, has also been superimposed because the impedance of the thin cable against the ground is high.

The observation results described above indicate that the output impedance of the signal applying section is extremely small and the level of the noise induced in the particular cable is extremely low. It was also found that diverse noises exist in the cables which are laid around the particular cable and which are in service.

The present invention provides a method for identifying a particular cable by taking advantage of the phenomenon described above.

Figure 30:
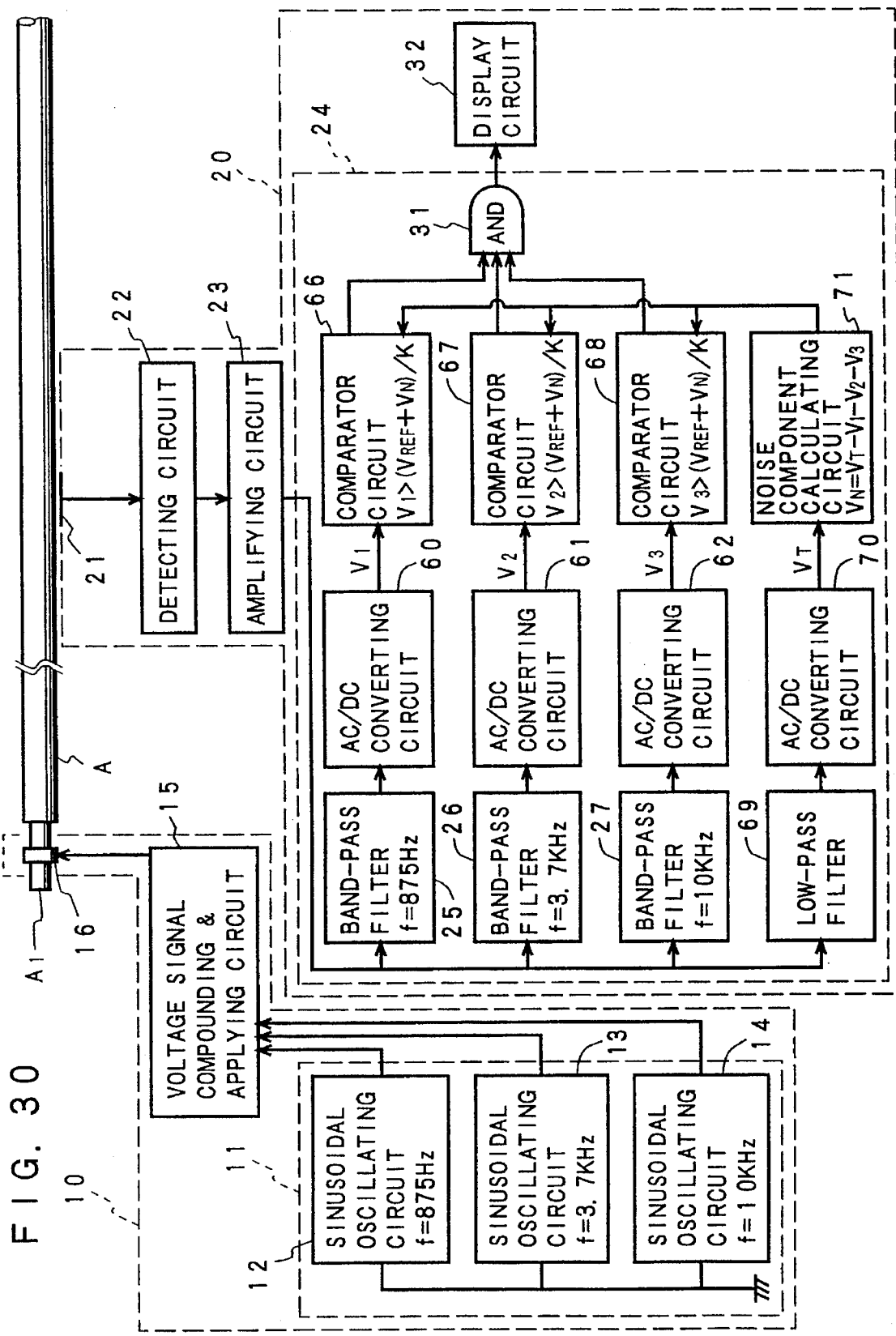
FIG. 30 is a block diagram which shows a configuration of a cable identifying apparatus which employs the fifth embodiment of the method for identifying objects to be identified according to the present invention.
Figure 33:
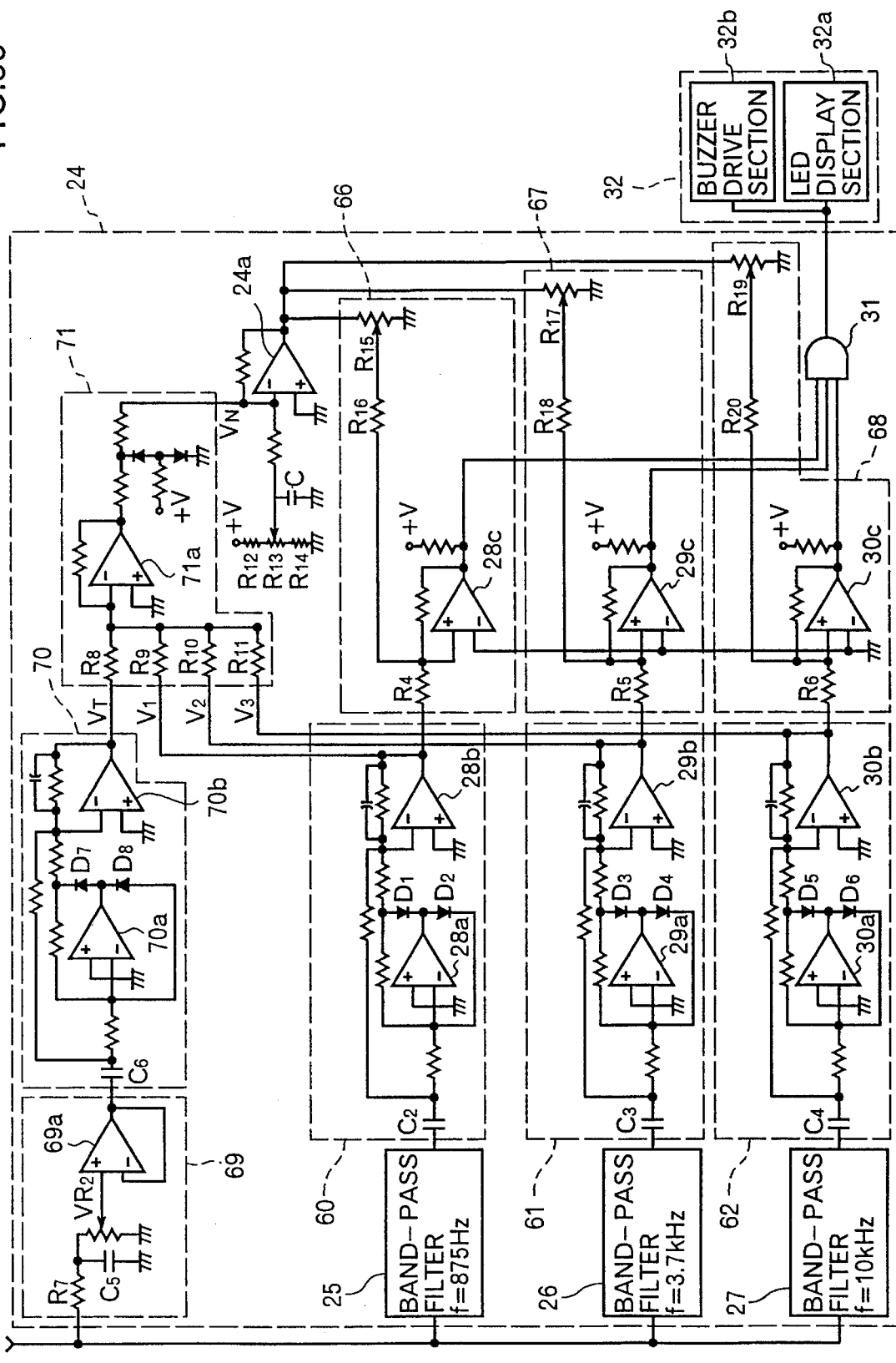
FIG. 33 is a circuit diagram showing a configuration of a signal identifying circuit shown in FIG. 30.

FIG. 30 is a block diagram showing the configuration of a cable identifying apparatus which employs the fifth embodiment of the method for identifying objects to be identified in accordance with the present invention. FIG. 33 is a circuit diagram showing a configuration of the signal identifying circuit shown in FIG. 30. In FIG. 30, the like parts as those in the first and fourth embodiments in FIG. 1 and FIG. 24, respectively, will use the same reference characters, and detailed explanation will be omitted. In FIG. 33, like part as those in FIG. 32 use the same reference numbers, and their detailed explanation is omitted.

Referring to FIG. 30, the cable identifying apparatus is comprised of a signal applying section 10 which applies a frequency signal of a particular frequency to conductor A1 of particular cable A sheathed with an insulator, and a detecting section 20 which detects the signal voltage of the applied frequency signal in contact or not in contact with particular cable A at any distance from the signal applying section 10, thereby identifying the cable.

As in the case of the first and fourth embodiments, the signal applying section 10 is comprised of the oscillating circuit section 11 consisting of sinusoidal oscillating circuits 12 through 14, the voltage signal compounding & applying circuit 15, and the clip 16; the sinusoidal oscillating circuits 12 through 14 are all earthed and they generate three channels of sinusoidal frequency signals of 875 [Hz], 3.7 [KHz], and 10 [KHz].

As in the case of the first and fourth embodiments, the detecting section 20 is comprised of the signal electrode 21, the detecting circuit 22, the amplifying circuit 23, and the display circuit 32.

The signal identifying circuit 24 is comprised of a band-pass filter 69 which lets noise components including frequency components pass through, an AC/DC converting circuit 70 which AC/DC converts the components that have passed through the band-pass filter 69, and a noise calculating circuit 71 which calculates the noise component out from the component, in addition to the band-pass filters 25 through 27, the AC/DC converting circuits 60 through 62, the comparator circuits 66 through 68, and the AND circuit 31 which are similar to those in the fourth embodiment.

The signal identifying circuit 24 comprises band-pass filters 25 to 27 similar to those in the fourth embodiment, AC/DC converting circuits 60 to 62, comparator circuits 66 to 68, an AND circuit 31, a low-pass filter 69, an AC/DC converting circuit 70 and a noise component calculating circuit 71.

Referring now to FIG. 33, the combination of each of the AC/DC converting circuits 60 to 62 and each of comparators 66 to 68 has almost the same configuration as that of each of the smoothing & comparator circuits 28 to 30 shown in FIG. 32.

However, there is the following difference between the identifying circuits 24 in FIGS. 32 and 33. More specifically, the respective frequency signals from the AC/DC converting circuits 60 to 62 are outputted individually to the comparator circuits 66 to 68, and are further outputted to the noise component calculating circuit 71 which will be described later. The comparator circuits 66 to 68 are, in common, provided with an adder circuit 24a, in addition to comparators 28c, 29c and 30c. Further, the adder circuit 24a adds a reference signal (reference signal level $V_{REF}$) generated by partial pressure resistors R12 to R14 capable of adjusting a resistance and a capacitor $C_7$ to an output voltage $V_N$ from the noise component calculating circuit 71, and sets a threshold value (voltage) on the basis of the above addition result.

In this embodiment, the adder circuit 24a is a component which is used common to the respective comparator circuits 66 to 68. The threshold value set by the adder circuit 24a is inputted to the respective comparators 28c, 29c and 30c through resistors $R_{15}$ to $R_{20}$ making three couples which correspond to the respective comparators. In this case, the threshold value inputted to the respective comparators 28c, 29c and 30c is proportional to a relation of $(V_{REF}+V_n)$. Moreover, in this embodiment, the proportional relationship is determined by the respective comparator circuits 66 to 68; however, three proportional constants K may be all the same, or different from each other.

On the other hand, the comparators 28c, 29c and 30c compare the threshold values with voltages V1, V2 and V3 (875 [Hz], 3.7 [KHz] and 10 [KHz] signals) of the frequency signals which are converted to a DC voltage signal. More specifically, the comparators 28c, 29c and 30c individually determine whether the respective voltages V1, V2 and V3 of the frequency signals are higher or lower than the threshold values preset in the respective comparators 28c, 29c and 30c. If the voltages of the frequency signals are higher than the threshold values, the respective comparators 28c, 29c and 30c set the outputs supplied to the AND circuit 31 to "1".

The AC/DC converting circuit 70 and the noise component calculating circuit 71 are provided corresponding to the low-pass filter 69. Referring to FIG. 33, the low-pass filter 69 comprises a resistor $R_7$ connected to the amplifying circuit 23, a capacitor $C_5$ and a variable resistor $VR_2$ individually having one end connected to the resistor $R_7$ and the other end grounded, and a voltage follower 69a connected to the variable resistor $VR_2$. Further, the low-pass filter 69 passes a noise component containing the respective frequency components inputted from the amplifying circuit 23 through the AC/DC converting circuit 70.

The AC/DC converting circuit 70 has a configuration similar to those of AC/DC converting circuits 60 to 62, and comprises two operational amplifiers 70a and 70b connected with the low-pass filter 69 through a capacitor $C_6$, and diodes $D_7$ and $D_8$. Also, the AC/DC converting circuit 70 converts a component passed through the low-pass filter 69 into a DC voltage signal, and outputs the converted component to the noise component calculating circuit 71.

The noise component calculating circuit 71 comprises a subtracter circuit 71a connected with the AC/DC converting circuit 70 through a resistor $R_8$ and connected with the output sides of the respective AC/DC converting circuits 60 to 62 through the respective resistors $R_9$ to $R_{11}$. More specifically, the subtracter circuit 71a of the noise component calculating circuit 71 calculates to the voltage $V_N$ of the noise component by subtracting the output voltage signals V1, V2 and V3 from the respective AC/DC converting circuits 60 to 62, from the voltage $V_T$ of the total DC voltage signal which is DC-converted by the AC/DC converting circuit 70. Thus, the noise component existing in the total component is calculated.

The judgment standard for the particular cable in the signal identifying circuit 24, i.e., the standard for setting the threshold values in the comparator circuits 66 through 68, will now be explained.

First, in this fifth embodiment, the output impedance of the signal applying section is minimized, and therefore, the level of the noise component superimposed on the particular cable will be extremely low. For the threshold values in the comparator circuits 66 through 68, the following setting standard, which is different from that of the fourth embodiment, is established to check the signal levels of the frequencies.

In this example, the setting standard for the threshold values in the comparator circuits 66 through 68 is established as follows:

$$V1\ [V] > (V_{REF}\ [V] + V_N)/K \qquad (20)$$

$$V2\ [V] > (V_{REF}\ [V] + V_N)/K \qquad (21)$$

$$V3\ [V] > (V_{REF}\ [V] + V_N)/K \qquad (22)$$

where $V_{REF}$: Preset reference signal level

K: Set proportional constant $V_N$: $V_T$−V1−V2−V3

In these inequalities (20) through (22), $V_{REF}$ is set to a minimum, constant value; there is no need to adjust the levels.

In this embodiment shown in FIG. 30, for example, $V_{REF}$ is set to 0.5 [V] and K to 3, and a cable is identified as the particular cable only if all three inequalities (20) through (22) are satisfied. By establishing such a judgment standard, the immunity of the identifying apparatus to noises can be significantly improved. The reason for this may be explained as set forth below.

In practice, it is very unlikely that only three different frequencies of noises, that are the same as the frequency signals to be applied, exist in a cable. In other words, the noises that actually exist have a wide range of frequencies and some of them are identical to the frequency signals to be applied but other frequency components are also included. Such noises result in increases in all $V_N$ and V1, V2 and V3.

Hence, in the fifth embodiment, a uniform judgment standard for a particular cable in the signal identifying circuit is established in relation to the signal levels. Further, the threshold values of the comparator circuits are automatically adjusted according the magnitude of a noise level to identify the particular cable. Owing to this characteristic, in this embodiment, the particular cable can be securely distinguished from other cables, and improper sensitivity adjustment, which tends to lead to deteriorated reliability, can be omitted. Moreover, in this embodiment, the rotary switch used for adjusting the sensitivity is unnecessary, thus saving the manufacturing cost.

In this embodiment, the threshold values of the comparator circuits are set to fixed values in relation to the signal levels, however, the present invention is not limited to that; the particular cable can alternatively be determined by the proportional relationship of the signal levels. For instance, the setting standard for the threshold values in the comparator circuits 31 through 33 are uniformly set as shown below:

$$V1 \; [V] > (V_{REF} + V_{N1})/K \qquad (23)$$

$$V2 \; [V] > (V_{REF} + V_{N2})/K \qquad (24)$$

$$V3 \; [V] > (V_{REF} + V_{N3})/K \qquad (25)$$

where $V_{N1}, V_{N2}, V_{N3}$: Noise levels in the vicinity of signal frequencies (875 [Hz], 3.7 [KHz], 10 [KHz])

A cable is identified as the particular cable only if all these three inequalities (23) through (25) are satisfied.

As in the case described above, the signal level detected from the particular cable by the detecting section 20 is determined by the mutual proportional relationship of the signal levels shown in inequalities (23) through (25) set in all comparator circuits 66 through 68 of the signal identifying circuit 24, thus permitting more accurate identification of the particular cable.

In brief, in the fifth embodiment, the signal voltage applied to the particular cable and the noise component are detected and the level of the noise component is added to the judgment standard to determine the signal level of each frequency. The judgment result is displayed through the display circuit, so that an operator can recognize it.

Thus, in this fifth embodiment, erroneous judgment of a particular cable due to a noise component is prevented, allowing the particular cable to be accurately identified.

The method for identifying objects to be identified in accordance with the present invention is not limited to the embodiments described above.

We claim:

1. A method for identifying a specified object from among a plurality of electrically conductive objects contained in a housing, the method comprising the steps of:

an applying step of:
compounding a plurality of signals with predetermined different frequencies, generated from a plurality of oscillating circuits, at substantially uniform signal levels by means of a compounding/applying circuit to obtain a compound signal, and
directly applying the compound signal to the specified object; and a detecting step of:
detecting a potential signal from one of the objects by means of a detecting section which employs an electrostatic coupling method,
separating a plurality of signals with the predetermined different frequencies from the potential signal by means of band-pass filters having passbands thereof corresponding to the predetermined different frequencies, respectively,
determining magnitudes and uniformity of signal levels of the separated signals by means of comparator circuits, and
judging that said one object is the specified object only when the detected potential signal is found to be identical with the compound signal directly applied to the specified object.

2. The method of claim 1, wherein said detecting step includes the step of separating frequency components of the detected potential signal other than the predetermined different frequencies as a noise component by means of noise separating means, the magnitudes and uniformity of the levels of the signals separated by the band-pass filters being determined by the comparator circuits in accordance with a noise level of the separated noise component.

3. A method for identifying a specified object from among a plurality electrically conductive objects contained in a housing, the method comprising the steps of:

an applying step of:
compounding a plurality of signals with predetermined different frequencies, generated from a plurality of oscillating circuits, at signal levels having a prescribed proportional relationship by means of a compounding/applying circuit to obtain a compound signal, and
directly applying the compound signal to the specified object; and a detecting step of:
detecting a potential signal from one of the objects by means of a detecting section which employs an electrostatic coupling method,
separating a plurality of signals with the predetermined different frequencies from the potential signal by means of band-pass filters having passbands thereof corresponding to the predetermined different frequencies, respectively,
determining magnitudes and proportional relationship of signal levels of the separated signals by means of comparator circuits, and
judging that said one object is the specified object only when the detected potential signal is found to be identical with the compound signal directly applied to the specified object.

4. The method of claim 3, wherein said detecting step includes separating frequency components of the detected potential signal other than the predetermined different frequencies as a noise component by means of noise separating means, the magnitudes and proportional relationship of the levels of the signals separated by the band-pass filters being determined by the comparator circuits in accordance with a noise level of the separated noise component.

5. The method of claim 3, wherein said specified objects are cables.

6. A method for identifying a specified object from among a plurality of electrically conductive objects contained in a housing, the method comprising:

an applying step of:
compounding signals of a plurality of signals with predetermined different frequencies, generated from a plurality of oscillating circuits, at substantially uniform signal levels in different combinations of frequencies by means of a combining/compounding circuit to obtain a plurality of compound signals, and directly applying each of said compound signals to the corresponding ones of specified objects; and a detecting step of:
detecting a potential signal from one of the objects by means of a detecting section which employs an electrostatic coupling method, separating a plurality of signals with the predetermined different frequencies from the potential signal by means of band-pass filters having passbands thereof corresponding to the predetermined different frequencies, respectively, determining the frequency combination of the separated signals by means of a combining circuit, determining magnitudes and uniformity of signal levels of the determined signals by means of comparator circuits, and judging that said one object is the specified object only when the detected potential signal is found to be identical with the compound signal directly applied to the specified object.

7. The method of claim 6, wherein said detecting step includes the step of separating frequency components of the detected potential signal other than the predetermined different frequencies as a noise component by means of noise separating means, the magnitudes and uniformity of the levels of the signals separated by the band-pass filters being determined by the comparator circuits in accordance with a noise level of the separated noise component.

8. A method for identifying a specified object from among a plurality of electrically conductive objects contained in a housing, the method comprising the steps of:

an applying step of:
compounding a plurality of signals with predetermined different frequencies, generated from a plurality of oscillating circuits, at signal levels having a prescribed proportional relationship and in different combinations of frequencies by means of a combining/compounding circuit to obtain a plurality of compound signals, and directly applying the compound signals to corresponding ones of specified objects; and a detecting step of:
detecting a potential signal from one of the objects by means of a detecting section which employs an electrostatic coupling method, separating a plurality of signals with the predetermined different frequencies from the potential signal by means of band-pass filters having passbands thereof corresponding to the predetermined different frequencies, respectively, determining the frequency combination of the separated signals by means of a combining circuit, determining magnitudes and proportional relationship of signal levels of the determined signals by means of comparator circuits, and judging that said one object is the specified object only when the detected potential signal is found to be identical with the compound signal directly applied to the specified object.

9. The method of claim 8, wherein said detecting step includes the step of separating frequency components of the detected potential signal other than the predetermined different frequencies as a noise component by means of noise separating means, the magnitudes and proportional relationship of the levels of the signals separated by the band-pass filters being determined by the comparator circuits in accordance with a noise level of the separated noise component.

10. The method of claim 8, wherein said specified objects are cables.

11. An apparatus for identifying a specified object from among a plurality of electrically conductive objects contained in a housing, the apparatus comprising:

oscillating circuits for generating a plurality of signals having predetermined different frequencies, respectively;

a compounding/applying circuit for compounding said plurality of generated signals at substantially uniform signal levels by means of an amplifier to obtain a compound signal, and for directly applying the compound signal to the specified object;

a detecting section for detecting a potential signal from one of the objects by an electrostatic coupling method; and an identifying circuit including:
band-pass filters having passbands thereof corresponding to the predetermined different frequencies, respectively, and separating a plurality of signals with the predetermined different frequencies from the detected potential signal only when the potential signal is detected from said one object, and comparator circuits for identifying the specified object by determining magnitudes and uniformity of signal levels of the separated signals.

12. The apparatus of claim 11, wherein said identifying circuit includes noise separating means for separating frequency components of the detected potential signal other than the predetermined different frequencies as a noise component, and said comparator circuits identify the specified object by determining the magnitudes and uniformity of the levels of the separated signals in accordance with a noise level of the separated noise component.

13. An apparatus for identifying a specified object from among a plurality of electrically conductive objects contained in a housing, the apparatus comprising:

oscillating circuits for generating a plurality of signals having predetermined different frequencies, respectively;

a compounding/applying circuit for compounding said plurality of generated signals at signal levels having a prescribed proportional relationship by means of an amplifier to obtain a compound signal, and for directly applying the compound signal to the specified object;

a detecting section for detecting a potential signal from one of the objects by an electrostatic coupling method; and an identifying circuit including:
band-pass filters having passbands thereof corresponding to the predetermined different frequencies, respectively, and separating a plurality of signals with the predetermined different frequencies from the detected potential signal one when the potential signal is detected from said one object, and comparator circuits for identifying the specified object by determining magnitudes and proportional relationship of signal levels of the separated signals.

14. The apparatus of claim 13, wherein said identifying circuit includes noise separating means for separating frequency components of the detected potential signal other than the predetermined different frequencies as a noise component, and said comparator circuits identify the specified object by determining the magnitudes and proportional relationship of the levels of the separated signals in accordance with a noise level of the separated noise component.

15. An apparatus for identifying a specified object from among a plurality of electrically conductive objects contained in a housing, the apparatus comprising:

oscillating circuits for generating a plurality of signals having predetermined different frequencies, respectively;

a combining/compounding circuit for compounding said plurality of signals with the respective different frequencies, generated from said oscillating circuits, at substantially uniform signal levels in different combinations of frequencies to obtain a plurality of compound signals;

an applying circuit for directly applying said plurality of compound signals to corresponding ones of specified objects;

a detecting section for detecting a potential signal from one of the objects by an electrostatic coupling method; and an identifying circuit including:
band-pass filters having passbands thereof corresponding to the predetermined different frequencies, respectively, and separating a plurality of signals with the predetermined different frequencies from the detected potential signal only when the potential signal is detected from said one object,
a combining circuit for determining the frequency combination of the separated signals, and
comparator circuits for identifying the specified object by determining magnitudes and uniformity of signal levels of the separated signals.

16. The apparatus of claim 15, wherein said identifying circuit includes noise separating means for separating frequency components of the detected potential signal other than the predetermined different frequencies as a noise component, and said comparator circuits identify the specified object by determining the magnitudes and uniformity of the levels of the separated signals in accordance with a noise level of the separated noise component.

17. An apparatus for identifying a specified object from among a plurality of electrically conductive objects contained in a housing, the apparatus comprising:

oscillating circuits for generating a plurality of signals having predetermined different frequencies, respectively;

a combining/compounding circuit for compounding said plurality of signals with the respective different frequencies, generated from said oscillating circuits, at signal levels having a prescribed proportional relationship and in different combinations of frequencies to obtain a plurality of compound signals;

an applying circuit for directly applying said plurality of compound signals to corresponding ones of specified objects;

a detecting section for detecting a potential signal from one of the objects by an electrostatic coupling method; and an identifying circuit including:
band-pass filters having passbands thereof corresponding to the predetermined different frequencies, respectively, and separating a plurality of signals with the predetermined different frequencies from the detected potential signal only when the potential signal is detected from said one object,
a combining circuit for determining the frequency combination of the separated signals, and
comparator circuits for identifying the specified object by determining magnitudes and proportional relationship of signal levels of the determined signals.

18. The apparatus of claim 17, wherein said identifying circuit includes noise separating means for separating frequency components of the detected potential signal other than the predetermined different frequencies as a noise component, and said comparator circuits identify the specified object by determining the magnitudes and proportional relationship of levels of the separated signals in accordance with a noise level of the separated noise component.

19. The method of claim 1, wherein said detecting step comprises subjecting a detected signal of a specific frequency to gain adjustment.

20. The method for identifying objects to be identified according to claim 1, wherein said specified objects are cables.

21. A method for identifying a specified object from among a plurality of electrically conductive objects contained in a housing, the method comprising:

an applying step of generating a compound signal by compounding a plurality of signals with predetermined different frequencies obtained from an oscillating circuit section, while keeping a specified one of electrically conductive objects in an ungrounded state and grounding unused electrically conductive objects and the oscillating circuit section and directly applying the compound signal to the specified object; and a detecting step of detecting a signal from each of electrically conductive objects by means of a detecting section employing an electrostatic coupling method and having sensitivity adjusting means, while adjusting a sensitivity of the sensitivity adjusting means in accordance with a voltage level of the detected signal, and identifying the specified object when the compound signal is detected from the object.

22. The method for identifying objects to be identified according to claim 6, wherein said specified objects are cables.

23. The apparatus of claim 11, wherein said detecting section comprises an electroscope, said electroscope equivalently forming a capacitor by providing a signal electrode on the specified object and by providing a grounding electrode on said signal electrode, said capacitor being connected in parallel to said input circuit to determine an input impedance of said electroscope, and said input circuit detecting the compound signal directly applied to the specified object.

24. The apparatus of claim 11, wherein said detecting section comprises an electroscope, said electroscope comprising an input circuit detecting the compound signal on the basis of an electrostatic coupling capacitance between a signal electrode provided on the specified object and the specified object to which the compound signal is directly applied, and a grounding electrode provided on said signal electrode via an insulating layer, said input circuit being connected in parallel to a capacitor formed equivalently by said signal electrode and grounding electrode, to determine an input impedance of said electroscope.

25. The apparatus of claim 15, wherein said detecting section comprises an electroscope, said electroscope equivalently forming a capacitor by providing a signal electrode on the specified object and by providing a grounding electrode on said signal electrode, said capacitor being connected in parallel to said input circuit to determine an input impedance of said electroscope, and said input circuit detecting the compound signal directly applied to the specified object.

26. The apparatus of claim 15, wherein said detecting section comprises an electroscope, said electroscope comprising an input circuit detecting the compound signal on the basis of an electrostatic coupling capacitance between a signal electrode provided on the specified object and the specified object to which the compound signal is directly applied, and a grounding electrode provided on said signal electrode via an insulating layer, said input circuit being connected in parallel to a capacitor formed equivalently by said signal electrode and grounding electrode, to determine an input impedance of said electroscope.

27. A method for identifying a specified object from among a plurality of electrically conductive objects contained in a housing, the method comprising:

an applying step of generating a compound signal by compounding a plurality of signals obtained from an oscillating circuit section and having predetermined different frequencies and a uniform signal level, and directly applying the compound to a specified one of electrically conductive objects; and a detecting step of detecting signals with the predetermined different frequencies forming the compound signal and noise components thereof, which signals are derived from each of electrically conductive objects, by means of a detecting section employing an electrostatic coupling method, and identifying the specified object by determining magnitudes and uniformity of the levels of the signals with the different frequencies based on noise levels of the detected noise components.

28. A method for identifying a specified object from among a plurality of electrically conductive objects contained in a housing, the method comprising:

an applying step of generating a compound signal by compounding a plurality of signals which are obtained from an oscillating circuit section, which have predetermined different frequencies, and of which signal levels have a predetermined relationship, and directly applying the compound signal to a specified one of electrically conductive objects; and a detecting step of detecting signals with the predetermined different frequencies forming the compound signal and noise components thereof, which signals are derived from each of electrically conductive objects, by means of a detecting section employing an electrostatic coupling method, and identifying the specified object by determining the predetermined relationship and magnitudes of the levels of the signals with the different frequencies based on noise levels of the detected noise components.

29. A method for identifying a specified object from among a plurality of electrically conductive objects contained in a housing, the method comprising:

an applying step of generating a plurality of compound signals by compounding a plurality of predetermined combinations of signals having different frequencies and having a uniform signal level, which signals are selected from among a plurality of signals with different frequencies obtained from an oscillating circuit section, and directly applying the compound signals to specified ones of electrically conductive objects, respectively; and a detecting step of detecting signals with the different frequencies forming each compound signal and noise components thereof, which signals are derived from each of electrically conductive objects, by means of a detecting section employing an electrostatic coupling method, and identifying the specified objects by determining magnitudes and uniformity of the levels of the signals with the different frequencies based on noise levels of the detected noise components.

30. A method for identifying a specified object from among a plurality of electrically conductive objects contained in a housing, the method comprising:

an applying step of generating a plurality of compound signals by compounding a plurality of predetermined combinations of signals having different frequencies and having a predetermined signal level relationship, which signals are selected from among a plurality of signals with different frequencies obtained from an oscillating circuit section and directly applying the compound signals to specified ones of electrically conductive objects, respectively; and a detecting step of detecting signals with the different frequencies forming each compound signal and noise components thereof, which signals are derived from each of electrically conductive objects, by means of a detecting section employing an electrostatic coupling method, and identifying the specified objects by determining the predetermined relationship and magnitudes of the levels of the signals wit the different frequencies based on noise levels of the detected noise components.

* * * * *